United States Patent
Machida

(10) Patent No.: US 9,167,184 B2
(45) Date of Patent: Oct. 20, 2015

(54) SOLID-STATE IMAGE TAKING DEVICE AND ELECTRONIC APPARATUS

(71) Applicant: Sony Corporation, Tokyo (JP)

(72) Inventor: Takashi Machida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/087,281

(22) Filed: Nov. 22, 2013

(65) Prior Publication Data

US 2014/0084142 A1 Mar. 27, 2014

Related U.S. Application Data

(62) Division of application No. 13/043,913, filed on Mar. 9, 2011, now Pat. No. 8,625,011.

(30) Foreign Application Priority Data

Mar. 25, 2010 (JP) ................................. 2010-070252

(51) Int. Cl.
  *H04N 5/378* (2011.01)
  *H04N 5/359* (2011.01)
  *H01L 27/146* (2006.01)
  *H04N 5/363* (2011.01)
  (Continued)

(52) U.S. Cl.
  CPC .......... *H04N 5/378* (2013.01); *H01L 27/14603* (2013.01); *H01L 27/14623* (2013.01); *H04N 5/3595* (2013.01); *H04N 5/363* (2013.01); *H04N 5/37452* (2013.01)

(58) Field of Classification Search
  CPC ..... H04N 5/378; H04N 5/363; H04N 5/3595; H04N 5/37452; H01L 27/14623; H01L 27/14603

USPC .................................. 348/302, 308, 315, 323
See application file for complete search history.

(56) References Cited

U.S. PATENT DOCUMENTS

| 4,942,474 A | 7/1990 | Akimoto et al. |
| 6,091,793 A | 7/2000 | Kamashita |
| (Continued) | | |

FOREIGN PATENT DOCUMENTS

| CN | 101355094 | 1/2009 |
| CN | 101562707 | 10/2009 |
| (Continued) | | |

OTHER PUBLICATIONS

Japanese Office Action issued in connection with related JP Patent Application No. 2010-070252 dated Feb. 12, 2014.

(Continued)

*Primary Examiner* — Gevell Selby
(74) *Attorney, Agent, or Firm* — Dentons US LLP

(57) ABSTRACT

A solid-state image taking device including a pixel section and a scan driving section wherein on each pixel column included in the pixel area determined in advance to serve as a pixel column having the unit pixels laid out in the scan direction, the opto-electric conversion section and the electric-charge holding section are laid out alternately and repeatedly, and on each of the pixel columns in the pixel area determined in advance, two the electric-charge holding sections of two adjacent ones of the unit pixels are laid out disproportionately toward one side of the scan direction with respect to the optical-path limiting section or the opto-electric conversion section.

5 Claims, 31 Drawing Sheets

(51) Int. Cl.
*H04N 5/374* (2011.01)
*H04N 5/3745* (2011.01)

(56) References Cited

U.S. PATENT DOCUMENTS

| | | | |
|---|---|---|---|
| 7,399,951 | B2 | 7/2008 | Morimoto et al. |
| 2004/0130757 | A1 | 7/2004 | Mabuchi |
| 2009/0251582 | A1 | 10/2009 | Oike |
| 2009/0256230 | A1* | 10/2009 | Watanabe ............ 257/435 |
| 2010/0176272 | A1* | 7/2010 | Itahashi ............ 250/208.1 |
| 2010/0330723 | A1* | 12/2010 | Okabe et al. ............ 438/59 |
| 2011/0032379 | A1* | 2/2011 | Kobayashi et al. ........ 348/222.1 |
| 2011/0085066 | A1 | 4/2011 | Sugawa et al. |

FOREIGN PATENT DOCUMENTS

| | | |
|---|---|---|
| CN | 101588506 | 11/2009 |
| JP | 01-243675 | 9/1989 |
| JP | 08-111821 | 4/1996 |
| JP | 11-177076 | 7/1999 |
| JP | 2004-140149 | 5/2004 |
| JP | 2005-129965 | 5/2005 |
| JP | 2006-311515 | 11/2006 |
| JP | 2007-116356 | 5/2007 |
| JP | 2008-004692 | 1/2008 |
| JP | 2009-268083 | 11/2009 |
| JP | 2009-272539 | 11/2009 |
| JP | 2010-045083 | 2/2010 |

OTHER PUBLICATIONS

Chinese Office Examination Report issued in connection with related Chinese Patent Application No. CN201110075897.01 dated Dec. 1, 2014.

* cited by examiner

F I G . 7
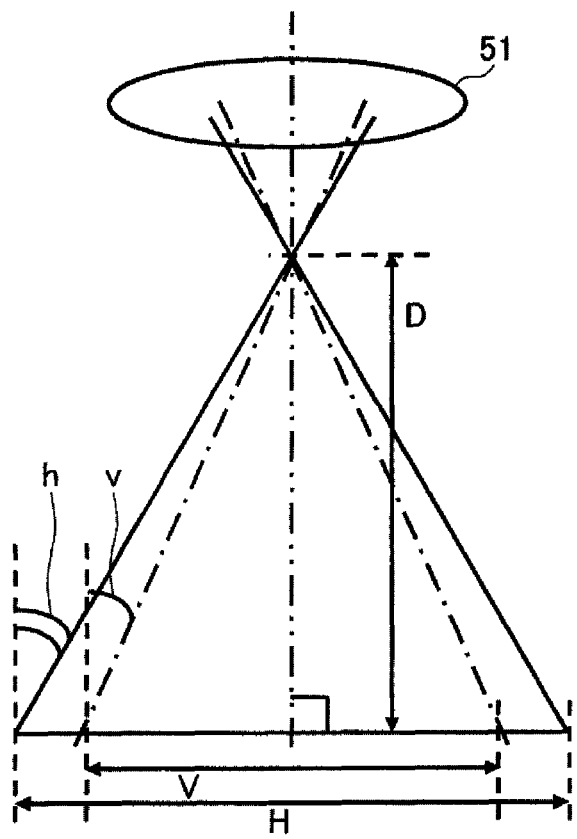

SOLID-STATE IMAGE TAKING DEVICE AND ELECTRONIC APPARATUS

RELATED APPLICATION DATA

This application is a division of U.S. patent application Ser. No. 13/043,913 filed Mar. 9, 2011, the entirety of which is incorporated herein by reference to the extent permitted by law. The present application claims the benefit of priority to Japanese Patent Application No. JP 2010-070252 filed on Mar. 25, 2010 in the Japan Patent Office, the entirety of which is incorporated by reference herein to the extent permitted by law.

BACKGROUND OF THE INVENTION

1. Field of the Invention

The present invention relates to a solid-state image taking device adopting an all-pixel read method for reading out pieces of electric charge at the same time from opto-electrical conversion elements each employed in one of all unit pixels forming a pixel array and relates to an electronic apparatus in which the device is embedded.

2. Description of the Related Art

One of typical examples of the solid-state image taking device is a CMOS image sensor for reading out opto-electric charge, which has been accumulated in a PN junction capacitor of a photodiode serving as the opto-electric conversion element (also referred to as hereafter as an opto-electric conversion section) of every unit pixel employed in the CMOS image sensor, through a MOS transistor of the pixel. The CMOS image sensor carries out an operation to read out pieces of opto-electric charge, which each have been accumulated in a photodiode, for every predetermined unit such as a pixel or a row of pixels. Opto-electric charge is signal electric charge obtained as a result of an opto-electric conversion process carried out by the photodiode. Thus, an exposure period during which opto-electric charge is accumulated cannot be made uniform for all pixels employed in the CMOS image sensor. As a result, a distortion is generated at an image taking time typically for a case in which an image taking object moves.

Typical Configuration of a Unit Pixel of the CMOS Image Sensor

FIG. 1 is a diagram showing the configuration of a unit pixel 100 employed in a CMOS image sensor according to an existing technology disclosed in Japanese Patent Laid-open No. 2009-268083 (hereinafter referred to as Patent Document 1).

As shown in FIG. 1, the unit pixel 100 employs a PD (photodiode) 101, a transfer gate transistor 102 denoted by reference symbol TRG and an N-type area 103 composing an FD (floating diffusion) capacitor denoted by reference symbol FD in the figure. In addition, the unit pixel 100 also has a reset transistor 104, an amplification transistor 105 and a select transistor 106.

In the unit pixel 100, the photodiode 101 is an embedded photodiode created by typically forming a P-type layer 113 on the surface of a P-type well layer 112 constructed on a semiconductor substrate 111 and embedding an N-type embedded layer 114 beneath the P-type layer 113. The transfer gate transistor 102 transfers electric charge accumulated in the PN junction of the photodiode 101 to the N-type area 103 composing the floating diffusion capacitor FD.

In the CMOS image sensor, the unit pixels 100 each having the configuration described above are laid out to form a unit-pixel matrix serving as an image taking section.

In the image taking section, the amount of signal electric charge transferred by the transfer gate transistor 102 from the photodiode 101 to the N-type area 103 is determined by a timing to apply a transfer pulse TRG to the gate electrode of the transfer gate transistor 102. A method of applying the transfer pulse TRG to the gate electrode of the transfer gate transistor 102 employed in every unit pixel at the same time is known as the all-pixel read method mentioned before.

Mechanical-Shutter Method

By the way, a typical example of a method for implementing an exposure operation of an image taking operation during almost simultaneous exposure periods for all pixels is a widely utilized mechanical-shutter method making use of a mechanical shutter serving as mechanical light shielding means.

This mechanical light shielding means carries out the exposure operation by starting the exposure period almost at the same time for all pixels and terminating the exposure period also almost at the same time for all the pixels.

In accordance with the mechanical-shutter method, the exposure periods are mechanically controlled in order to make the exposure periods all but uniform for all unit pixels. The exposure period is a period during which light incident to the photodiode 101 is converted into opto-electric charge serving as signal electric charge. Then, when the mechanical shutter is closed, the unit pixel enters a state in which actually no opto-electric charge is generated in the photodiode 101. After the mechanical shutter has been closed, the signal electric charge is sequentially read out from the photodiode 101. Since the mechanical-shutter method requires that the mechanical light shielding means be used, however, it is difficult to reduce the size of the CMOS image sensor. In addition, since there is a limit on the mechanical driving speed of the mechanical light shielding means, the simultaneity of mechanical-shutter method is inferior to that of an electrical method.

All-Pixel Simultaneous Read Operation Using an Electronic Shutter (Global Exposure)

In order to prevent a distortion from being generated at an image taking time as described above, an image taking operation is carried out by making use of an electronic shutter to execute electrical control for setting an all-pixel simultaneous exposure period. The operation carried out for setting this all-pixel simultaneous exposure period is referred to as the so-called global exposure operation. By referring to FIG. 1, the following description explains steps (1) to (6) of a procedure of the global exposure operation disclosed in documents such as Patent Document 1.

Step (1)

Light incident to the photodiode 101 is subjected to an opto-electric conversion process of converting the light into signal electric charge in the semiconductor substrate 111. In the case of the configuration shown in FIG. 1 for example, electrons serving as the signal electric charge are accumulated in the N-type embedded layer 114 whereas holes are discarded from a P-type area not shown in the figure to the outside. Some holes are caught by the P-type layer 113 so that the signal electric charge is not trapped at a substrate surface level introduced by a defect and the caught holes serve as fixed electric charge having an effect on the electrons accumulated in the N-type embedded layer 114. As a result, the quantity of the saturated electric charge accumulated in the N-type embedded layer 114 is stabilized.

Step (2)

When a transfer pulse TRG is applied to the gate electrode of the transfer gate transistor 102, an electric-charge exhausting operation is carried out at the same time on all unit pixels in order to discard electric charge accumulated in the photodiode 101 employed in every unit pixel, that is, in order to make the photodiode 101 empty.

Then, in an exposure operation, on the other hand, signal electric charge (that is, opto-electric charge) obtained as a result of an opto-electric conversion process is accumulated in the PN junction capacitor of the photodiode 101.

Step (3)

At the end of the exposure period during which the exposure operation described above is carried out, the transfer pulse TRG is again applied to the gate electrode of the transfer gate transistor 102 in order to turn on the transfer gate transistor 102 of every unit pixel 100 for all unit pixels 100 at the same time. With the transfer gate transistor 102 turned on, all the electric charge accumulated in the photodiode 101 employed in every unit pixel 100 is transferred to the N-type area 103 serving as the floating diffusion capacitor FD of the unit pixel 100 for all unit pixels 100 at the same time. On the falling edge of the transfer pulse TRG applied to the transfer gate transistor 102 for the second time, the transfer gate transistor 102 is turned off, entering a closed state. Thereafter, the opto-electric charge accumulated in the photodiode 101 of every unit pixel 100 during the same exposure period for all the unit pixels 100 is held in the floating diffusion capacitor FD employed in the same unit pixel 100.

Step (4)

The amplification transistor 105 amplifies a signal level representing the amount of the signal electric charge held in the N-type area 103. When a select pulse SEL is applied to the gate electrode of the select transistor 106, the amplified signal level is asserted on a vertical signal line 200 in the so-called D phase read operation. The D phase read operation to read out the amplified signal can be carried out for every unit pixel 100. In this procedure, however, the operation to read out the amplified signal is carried out for every row of unit pixels 100 on a one-row-after-another basis.

Step (5)

Then, when a reset pulse RST is applied to the gate electrode of the reset transistor 104, the amount of electric charge held in the N-type area 103 is reset.

Step (6)

Thereafter, the select pulse SEL is again applied to the gate electrode of the select transistor 106 in order to assert a reset level on the vertical signal line 200 in the so-called P phase read operation.

After the signal level and the reset level have been asserted on the vertical signal line 200, in signal processing carried out at a later stage, the reset level is used to eliminate noises from the signal level.

Structure of Unit Pixel Having a Memory

Patent Document 1 and Japanese Patent Laid-open No. Hei 11-177076 (hereinafter referred to as Patent Document 4), Japanese Patent Laid-open No. 2006-311515 (hereinafter referred to as Patent Document 5), and Japanese Patent Laid-open No. 2008-004692 (hereinafter referred to as Patent Document 6) disclose the structure of a unit pixel further having a memory section added to the configuration shown in FIG. 1. In some cases, the memory section is also referred to as an electric-charge storage section.

FIG. 2 is a diagram showing the configuration of a unit pixel 300 including a memory section 107 described in Patent Document 1.

In addition to the N-type area 103 created in the P-type well layer 112 on a silicon substrate serving as the semiconductor substrate 111 to serve as the floating diffusion capacitor FD, the unit pixel 300 shown in FIG. 2 also employs the memory section 107 denoted by reference symbol MEM in the figure.

In the same way as the N-type area 103, the memory section 107 is created from an N-type semiconductor area. The memory section 107 is used for temporarily stored optoelectric charge accumulated in the photodiode 101 and transferred from the photodiode 101. A transfer gate transistor 108 denoted by reference symbol TRX is provided between the photodiode 101 and the memory section 107 to function as means for controlling a transfer channel between the photodiode 101 and the memory section 107. To put it concretely, opto-electric charge accumulated in the photodiode 101 is transferred to the memory section 107 by way of the transfer gate transistor 108.

SUMMARY OF THE INVENTION

In the so-called rolling shutter method for determining the amount of electric charge accumulated in unit pixels provided on a row for every unit-pixel row for example, an image distortion causing an image to be seen as an inclined image is generated with ease in typically a moving-image taking operation. For more information, the reader is advised to refer to documents such as Japanese Patent Laid-open No. 2004-140149 (hereinafter referred to as Patent Document 2). Thus, if an all-pixel read method generating no image distortion is adopted, by merely applying the existing technology described in the document, the following demerits will be encountered.

Let noise elimination processing be carried out by making use of a D phase level (also referred to as a signal level) and a P phase level (also referred to as a noise level or a reset level) which are read out in the D phase read operation and the P phase read operation respectively in the pixel circuit configuration shown in FIG. 1 as described above. In this case, after the D phase read operation has been carried out to read out the signal level, the P phase read operation is performed after resetting the N-type area 103 in order to read out the noise level. Thus, kTC noises generated in the reset operation carried out to reset the N-type area 103 cannot be eliminated. As a result, the quality of the image deteriorates. The kTC noises can be considered to be a sort of thermal noise.

The kTC noise generated in the reset operation is a random noise caused by a switching operation carried out by the reset transistor 104 during the reset operation. Thus, if a level prior to the transfer of electric charge from the photodiode 101 to the floating diffusion capacitor FD is not used, the noise of the signal level cannot be eliminated with a high degree of accuracy. This is because the noise of the signal level is eliminated by carrying out the reset operation after the signal level has been read out as a level representing the amount of electric charge transferred from the photodiode 101 to the floating diffusion capacitor FD for all unit pixels at the same time. By getting rid of the noise in this way, a noise caused by an offset error or the like can be eliminated. However, the kTC noise cannot.

In the following description, the period of the operation carried out to read out the signal level is referred to as a D period whereas the period of the operation carried out to read out the reset level is referred to as a P period. On the boundary surface between an Si material used for making the semiconductor substrate 111 and an $SiO_2$ material used for making a gate insulation film or the like, there are a number of crystal defects so that a dark current is generated with ease and added to the signal level. A variety of quantities such as the magnitude of the dark current vary. In particular, the magnitude of the dark current varies in accordance with the order in which electric charge held in the floating diffusion capacitor FD is read out from the floating diffusion capacitor FD. For more information, the reader is advised to refer to documents such as Patent Document 2 and Japanese Patent Laid-open No. Hei 01-243675 (hereinafter referred to as Patent Document 3). The variations in dark-current magnitude cannot be cancelled too by merely adopting the noise elimination method making use of the reset level.

In order to solve such problems raised by the reset-noise elimination methods disclosed in documents such as Patent Documents 2 and 3, there have been provided technologies disclosed in Patent Documents 1 and 4 to 6 mentioned before. In accordance with these technologies, a memory section 107 also referred to as an electric-charge storage section is provided between the opto-electric conversion section PD and the floating diffusion capacitor FD in the pixel circuit as shown for example in FIG. 2.

The memory section 107 is provided as shown in FIG. 2 in order to make the levels of the reset noise (or, strictly speaking, the kTC noise) uniform for all unit pixels 300.

The kTC noises are electric-potential fluctuations left in the floating diffusion capacitor FD during the control of the MOS transistor even after induction noises have been absorbed. The kTC noises are thermal noises generated in the channel resistor of the MOS transistor.

If the memory section 107 is not provided, a sequence of read operations is carried out as follows. First of all, the signal level is read out from the N-type area 103 and, then, the reset level is read out from the N-type area 103 as described earlier.

With the memory section 107 newly added to the pixel circuit, on the other hand, the signal electric charge also referred to as the opto-electric charge can be stored temporarily in the memory section 107. Thus, even in the case of an all-pixel read operation, a reversed sequence of read operations can be adopted and carried out as follows. First of all, the reset level is read out from the N-type area 103 and, then, the signal level is read out from the N-type area 103. By carrying out the reversed sequence of read operations in this way, a reset noise having a level about equal to the reset level read out earlier is superposed on the signal level in the electric-charge transfer through the same transistor. Thus, the reset noise can be eliminated with ease in noise elimination processing carried out later.

By adoption of the pixel configuration including the memory section 107, it is possible to eliminate the reset noise which is relatively large in comparison with a variety of random noises.

On the presumption that the pixel configuration including the memory section 107 is adopted, in order to further eliminate noises, it is necessary to eliminate noise components such as smear components having an effect on accumulated electric charge and causing an alias signal. In general, smear components are noise components superposed on signal electric charge also referred to as opto-electric charge read out from an opto-electric conversion element such as a photodiode and accumulated temporarily in a memory before being transferred to a destination in a way similar to an operation carried out by for example a vertical transfer register employed in a CCD image sensor.

If a memory section used for temporarily accumulating signal electric charge also referred to as opto-electric charge is provided in the pixel configuration, a countermeasure against the smear noise is required.

As a countermeasure against the smear noise, Patent Documents 1 and 4 to 6 disclose a configuration in which a light shielding film is used to shield the memory section against light. In addition, patent reference 6 discloses a structure in which a P-type embedded layer is provided on the substrate deeper side of an N-type electric-charge storage section corresponding to the memory section 107 employed in the unit pixel 300 shown in FIG. 2. The electric-potential barrier of the P-type embedded layer prevents electric charge, which causes smear noises to be generated on the substrate deeper side, from diffusing into the N-type electric-charge storage section.

By adoption of such a configuration, it is possible to get rid of smear components generated in each individual unit pixel.

The memory electric accumulation period is a period between an operation to transfer opto-electric charge from the opto-electric conversion section PD to the memory section at the same time for all unit pixels and an operation to transfer the opto-electric charge from the memory section to the floating diffusion capacitor FD. Relative to the signal component, the quantity of a noise including the smear component as a main component increases as the memory electric accumulation period becomes longer. Thus, if the memory electric accumulation period varies from pixel to pixel, the quantity of such a noise also varies from pixel to pixel as well. In addition, an inclined light component causing the smear component is also not uniform for all unit pixels. Thus, by merely applying the existing technologies disclosed in the Patent Documents, it is difficult to eliminate the noise having a quantity not uniform for all unit pixels.

The fact that the quantity of a noise including the smear component as a main component increases as the memory electric accumulation period becomes longer and the fact that there is an effect of an inclined light component causing the smear component as described above can be said to hold true for not only the memory section, but also to the floating diffusion capacitor FD, which is used for temporarily holding signal electric charge, as well. In addition, in some configurations, a plurality of floating diffusion capacitors FD may exist along a route through which signal electric charge is read out from the memory section (or the opto-electric conversion section PD).

In accordance with what is written in this invention specification, signal electric charge is transferred from the opto-electric conversion section at the same time for all unit pixels. In addition, an area used for holding electric charge is referred to as an electric-charge holding section or simply as a holding section. That is to say, in accordance with a single FD method to be described later, an FD area playing a role as a section for converting electric charge into a voltage expressed in terms of variations in electric potential and a memory section MEM provided between the opto-electric conversion section and the FD area are each referred to as an electric-charge holding section or simply as a holding section.

The present invention proposes a pixel internal layout structure capable of making noise components such as smear noise components, which have an effect on accumulated opto-electric charge, uniform throughout the layout surface of all unit pixels. In addition, the proposed pixel internal layout structure is also capable of sufficiently eliminating the noise components. The present invention also provides a solid-state image taking device employing unit pixels each having such a pixel internal layout structure. On top of that, the present invention also provides electronic apparatus each employing a solid-state image taking device capable of sufficiently eliminating noise components such as smear noise components.

A solid-state image taking device according to a first mode of the present invention employs a pixel section and a scan driving section. The pixel section includes a plurality of unit pixels laid out to form a pixel matrix and to serve as unit pixels which have read sections and are each provided with a pixel opening prescribed by an optical-path limiting section created on a semiconductor substrate and with an opto-electric conversion section as well as an electric-charge holding section. On the other hand, the scan driving section controls an operation to transfer electric charge from the opto-electric conversion section to the electric-charge holding section at the same time for the unit pixels in a pixel area determined in advance in the pixel matrix. The scan driving section also scans and drives the read sections in one scan direction.

On each pixel column included in the pixel area determined in advance to serve as a pixel column having the unit pixels laid out in the scan direction, the opto-electric conversion section and the electric-charge holding section are laid out alternately and repeatedly.

In addition, on each of the pixel columns in the pixel area determined in advance, two aforementioned electric-charge holding sections of two adjacent ones of the unit pixels are laid out disproportionately toward one side of the scan direction with respect to the optical-path limiting section or the opto-electric conversion section.

In accordance with the configuration described above, the scan driving section scans the read sections of all the unit pixels in a scan direction of the pixel column during a scan operation and drives the read sections. In this scan operation, electric charge generated in the opto-electric conversion section is transferred to the electric-charge holding section at the same time for all the pixel units. The scan operation is started with a pixel row at one end of the scan direction and carried out toward a pixel row at the other end of the scan direction sequentially on a one-row-after-another basis.

In every unit pixel, on the scan-start side of the scan direction of the scan operation, the opto-electric conversion section of the unit pixel or the electric-charge holding section of the unit pixel is placed whereas, on the scan-end side of the scan direction of the scan operation, the electric-charge holding section of the unit pixel or the opto-electric conversion section of the unit pixel is placed. For example, on the scan-start side of the scan direction of the scan operation, the electric-charge holding section of the unit pixel is placed whereas, on the scan-end side of the scan direction of the scan operation, the opto-electric conversion section of the unit pixel is placed. In addition, two aforementioned electric-charge holding sections are laid out disproportionately toward one side of the scan direction with respect to the optical-path limiting section or the opto-electric conversion section. For example, in comparison with the distance between the opto-electric conversion section of a certain unit pixel and the electric-charge holding section of the same unit pixel located on the scan start side, the distance between the opto-electric conversion section of the unit pixel and the opto-electric conversion section of another unit pixel located on the scan end side is set at a large value.

Thus, in a unit pixel placed on the scan end side of a pixel column oriented in the scan direction as a unit pixel including an electric-charge holding section with a long electric-charge holding period, the magnitude of a light component entering from a side at a short distance is greater than the magnitude of a light component entering from a side at a long distance. This is because, when the solid-state image taking device is being used, in the optical lens, there are generally a number of light components dispersed from the optical axis of the optical lens to the outer side. Thus, in the pixel section, the number of light components most inclined on the scan start row and the scan end row generally increases in comparison with the total quantity of incident light. Accordingly, the quantity of light causing noises in the electric-charge holding section decreases due to inclined leak light and, the closer the location of the unit pixel to the scan end side, the larger the decrease, so that the number of smear components is reduced.

This relation is reversed on the scan start side with relatively short electric-charge accumulation periods. Thus, more leak light hits the electric-charge holding section. Since the electric-charge accumulation period is short from the beginning, however, an abrupt increase in smear-component count (that is, an abrupt increase in noise count) is not observed.

As a result, in accordance with the pixel internal layout structure proposed by the present invention, by virtue of the electric-charge accumulation period and the reversed relation, the quantity of leak light is adjusted so that, as a whole, the number of noise components is reduced uniformly to a low level.

A solid-state image taking device according to a second mode of the present invention is different from the solid-state image taking device according to the first mode of the present invention in that, in the case of the solid-state image taking device according to the second mode of the present invention, in every unit pixel of the pixel matrix, the electric-charge holding section is placed on the start side of the scan direction whereas the opto-electric conversion section is placed on the end side of the scan direction.

An electronic apparatus according to a third mode of the present invention includes an optical system employing the solid-state image taking device according to the first mode of the present invention.

In particular, a small or thin electronic apparatus in which light incident to the solid-state image taking device includes a number of inclined components has a big merit of being capable of eliminating noises by virtue of the distance prescriptions described above.

In accordance with the present invention, there is provided a solid-state image taking device capable of making noise components such as smear noise components, which have an effect on accumulated opto-electric charge, uniform throughout the layout surface of all unit pixels and also capable of sufficiently eliminating the noise components. In addition, also in accordance with the present invention, there are provided electronic apparatus each employing a solid-state image taking device capable of sufficiently eliminating noise components such as smear noise components.

BRIEF DESCRIPTION OF THE DRAWINGS

FIG. 7 is a model diagram showing how the lens group converges incident light toward the pixel array represented by its cross sections spread in the H (horizontal) and V (vertical) directions;

DETAILED DESCRIPTION OF THE PREFERRED EMBODIMENTS

Figure 1:
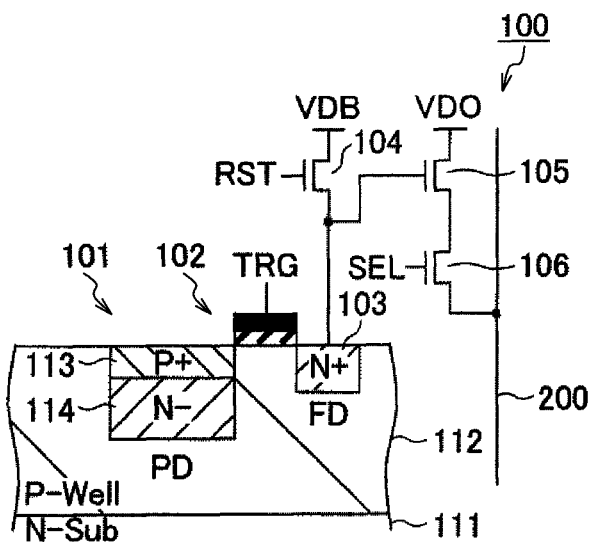
FIG. 1 is a diagram showing the configuration of a unit pixel employed in a CMOS image sensor according to an existing technology.

With the CMOS image sensor taken as an example, embodiments of the present invention are explained by referring to diagrams in chapters arranged as follows.

1: First Embodiment

In the first embodiment, the shifts of electric-charge holding sections on the two scan-direction sides of an opto-electric conversion section from the opto-electric conversion section are expressed in terms of the magnitudes of distances between the electric-charge holding sections and the opto-electric conversion section.

2: Second Embodiment

In the second embodiment, the shifts of electric-charge holding sections on the two scan-direction sides of an incident light path limiting section from the incident light path limiting section are expressed in terms of the magnitudes of distances between the electric-charge holding sections and the light shielding edges of the incident light path limiting section.

3: Third Embodiment

In the third embodiment, the shifts of electric-charge holding sections on the two scan-direction sides of an incident light path limiting section from the incident light path limiting section are expressed in terms of the magnitudes of distances between the electric-charge holding sections and the wire-layer edges of the incident light path limiting section.

4: Fourth Embodiment

The fourth embodiment implements a pixel internal layout in which a pixel transistor area serving as a read section is provided between a memory section and an opto-electric conversion section.

5: Fifth Embodiment

The fifth embodiment implements a pixel internal layout in which no memory section is used and an floating diffusion capacitor FD functions as an electric-charge holding section.

6: Sixth Embodiment

The sixth embodiment implements a pixel internal layout in which a light shielding section is also capable of serving as a wire.

7: Seventh Embodiment

The seventh embodiment implements a pixel internal layout in which a gate electrode driven by a pixel driving line is shared by two unit pixels.

8: Eighth Embodiment

In the eighth embodiment, the pixel array is split into two portions and a typical scan operation is carried out on the portions.

9: Read Method Common to the Embodiments
10: Modified System Configurations
11: Other Modified Versions
12: Typical Applications (Embodiments of Electronic Apparatus)
13: Effects of the Embodiments (Conclusion)

1: First Embodiment

A first embodiment has been proposed on the basis of results of paying attention to the fact that unevenness of smear components is seen in the scan direction and determining causes of the unevenness. The first embodiment of the present invention is an embodiment implementing an internal layout structure adopted by a unit pixel to serve as a structure capable of reducing smear components uniformly and sufficiently throughout all unit pixels.

First of all, the following description explains the results of determining the causes of the unevenness seen in the scan direction as the unevenness of smear components. Then, as a typical application of the present invention, the following description explains a CMOS image sensor including countermeasures taken by the first embodiment in the form of the internal layout structure of the unit pixel.

Noise Unevenness in the Scan Direction

A global shutter driving operation is carried out in a pixel structure including an opto-electric conversion section PD and an electric-charge holding section which can be a memory section MEM or a floating diffusion capacitor FD. In this case, if a signal read operation is carried out after a reset operation in accordance with the existing technologies disclosed in Patent Documents 1 and 4 to 6 explained earlier, the noise per unit pixel can be reduced to a value lower than those of the existing structures according to the existing technologies.

If the entire pixel array is seen, however, a phenomenon has been observed from results of analyses of noises. Observation of this phenomenon has led to a finding that, the larger the order number of a pixel row being scanned, selected and subjected to a read operation by a vertical driving section, undesirably, the larger the noise quantity. This phenomenon is further explained by referring to FIGS. 1 and 2 as follows.

In the global shutter driving operation, the transfer gate transistor 102 is turned on at the same time for all unit pixels in order to transfer opto-electric charge from the photodiode 101 serving as the opto-electric conversion section PD to the electric-charge holding section by way of the transfer gate transistor 102. In the case of the unit pixel 100 shown in FIG. 1, the electric-charge holding section is the floating diffusion capacitor FD whereas, in the case of the unit pixel 300 shown in FIG. 2, the electric-charge holding section is the memory section 107. After this electric-charge transfer operation, the vertical driving section scans pixel rows in the scan direction and selects one of the pixel rows on a one-row-after-another basis in order to output opto-electric charge from the electric-charge holding sections of the selected pixel row.

In the case of a typical pixel array having 1,000 pixel rows for example, the electric-charge holding period of unit pixels on the 1,000th pixel row selected last is about 1,000 times the electric-charge holding period of unit pixels on the 1st pixel row selected first.

Figure 3:
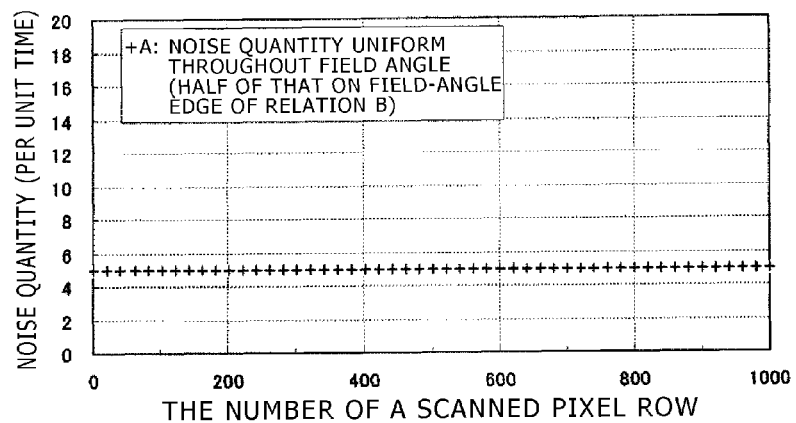
FIG. 3 is a correlation diagram showing a relation between the number of a scanned pixel row and the noise quantity per unit time.
Figure 4:
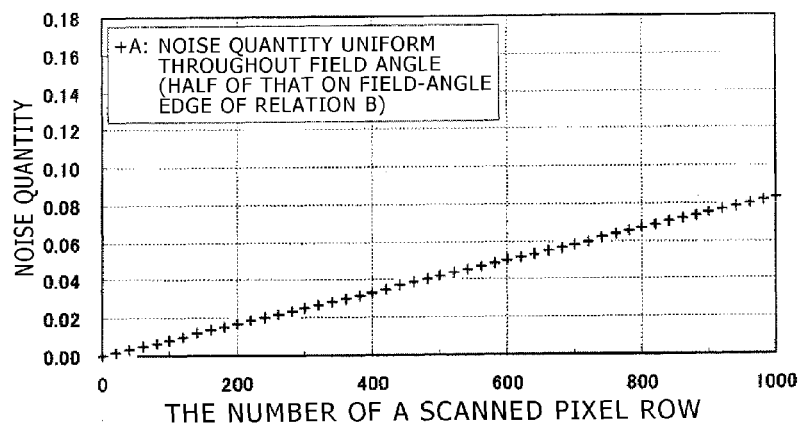
FIG. 4 is a correlation diagram showing a relation between the number of a scanned pixel row and the noise quantity of the noise actually accumulated during an electric-charge holding period.
Figure 5:
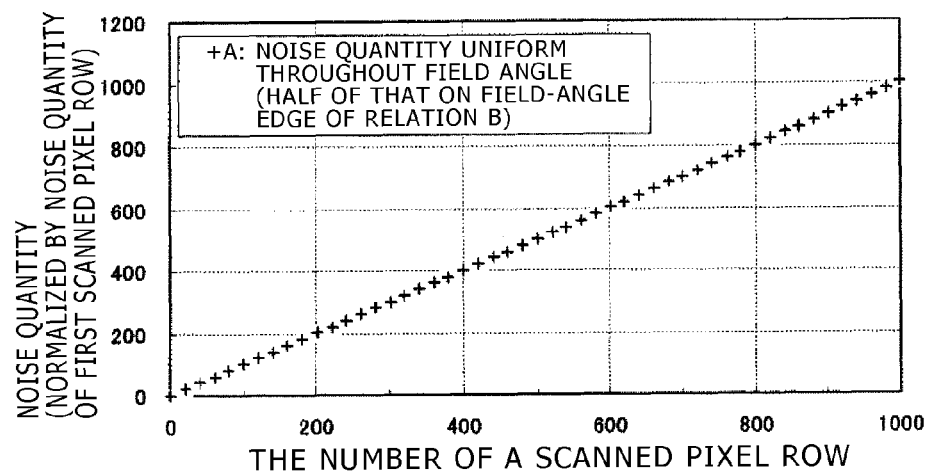
FIG. 5 is a correlation diagram showing a relation between the number of a scanned pixel row and a normalized noise quantity of the noise accumulated during an electric-charge holding period.

FIGS. 3 to 5 are each a correlation diagram showing a relation between the numbers assigned to a scanned pixel row also referred to hereafter simply as a pixel row and a noise quantity. For the sake of simplicity, the relation shown in each of these correlation diagrams is drawn on the assumption that light is radiated to all unit pixels uniformly.

The X axis of each of FIGS. 3 to 5 represents a number assigned to a scanned pixel row which is a pixel row subjected to a scan operation. In this case, the pixel array has 1,000 pixel rows. That is to say, the pixel row provided with a row number of 1 is the pixel row scanned first whereas the pixel row provided with a row number of 1,000 is the pixel row scanned last.

Since it is assumed that light is radiated to all unit pixels uniformly, the noise quantity per unit time such as 1 second is a constant not dependent on the number of the pixel row as shown in FIG. 3. In the case of the relation shown in this figure, the constant is set at 5 (without a unit).

If the frame rate is assumed to be 60 fps, the pixel row scanned last has an electric-charge holding period of $1/60$ seconds. In this case, the difference in electric-charge holding period between a pixel row provided with a row number of i and a pixel row provided with a row number of (i+1) where i is an integer in the range 1 to 999 is 1/60/1000 seconds. In addition, the electric-charge holding period of a pixel row provided with a row number of i is $1/60/1000 \times i$ seconds.

As is obvious from the above description, the noise quantity of the noise accumulated during the electric-charge holding period of a pixel row is a product obtained as a result of multiplying the noise quantity per unit time by the electric-charge holding period. As described above, the noise quantity per unit time is a constant set at 5/second. Thus, the noise quantity of the noise accumulated during the electric-charge holding period of a pixel row increases linearly with the number of the pixel row as shown in FIG. 4. That is to say, the noise quantity of the noise accumulated during the electric-charge holding period of a pixel row is proportional to the number of the pixel row or, the later the time at which a pixel row is scanned, the larger the noise quantity.

FIG. 5 is a correlation diagram showing a relation between the number of a scanned pixel row and a normalized noise quantity of the noise accumulated during an electric-charge holding period. The normalized noise quantity is obtained as a result of normalizing the noise quantity shown in FIG. 4 by dividing the noise quantity shown in FIG. 4 by the noise quantity of the pixel row scanned first.

As shown in FIG. 5, the noise quantity of a pixel row provided with a row number of i is i times the noise quantity of a pixel row provided with a row number of 1 where i is an integer in the range 1 to imax which is 1,000. That is to say, on the assumption that light is radiated to all unit pixels at the same level, the quantity of the noise accumulated in the electric-charge holding section of each unit pixel on a pixel row scanned last is 1,000 times the quantity of the noise accumulated in the electric-charge holding section of each unit pixel on a pixel row scanned first.

The relations shown in FIGS. 3 to 5 are obtained on the assumption that light is radiated to all unit pixels uniformly so that the noise quantity per unit time such as 1 second is a constant not dependent on the number assigned to the pixel row. In the case of an actual pixel array, however, depending on the position (or the field angle) of the pixel row in the pixel array, the noise quantity per unit time varies.

Next, the field angle cited above and an incidence angle are explained.

Figure 6:
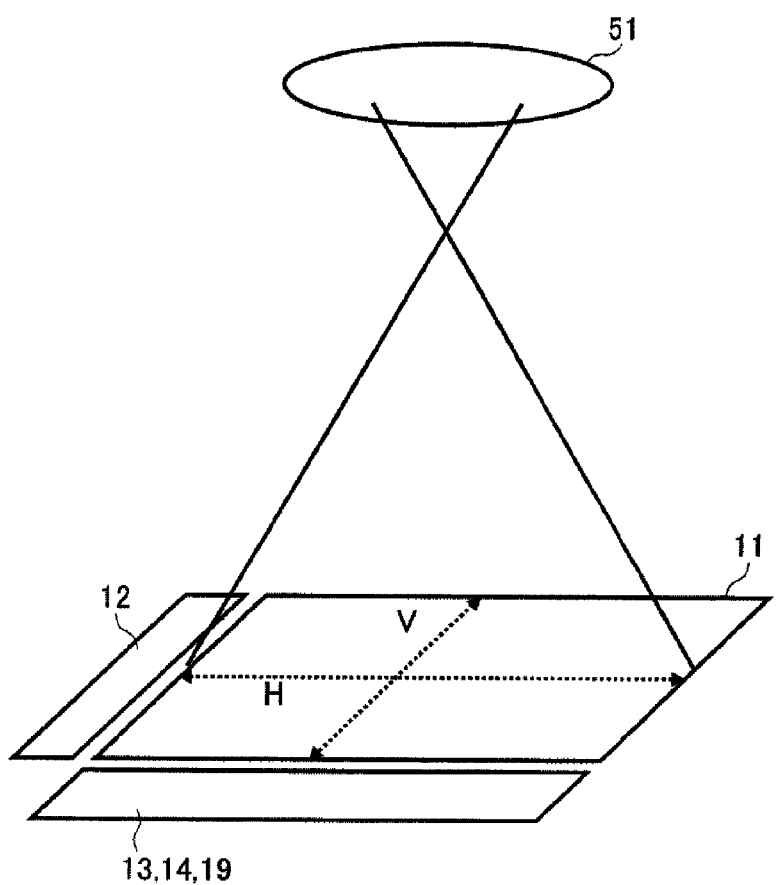
FIG. 6 is an image diagram for a case in which a lens group converges incident light toward a pixel array.

FIG. 6 is an image diagram for a case in which a lens group converges incident light toward a pixel array. In FIG. 6, reference numeral 11 denotes the pixel array whereas reference numeral 12 denotes a vertical driving section. Reference numerals 13, 14 and 19 denote a column processing section, a horizontal driving section and a data storage section respectively. Reference numeral 51 denotes the lens group employed in a camera section included in an electronic apparatus having the CMOS image sensor.

As shown in FIG. 6, unit pixels are laid out on the pixel array 11 in the H (horizontal) and V (vertical) directions. In general, the V-direction size of the pixel array 11 is smaller than the H-direction size thereof. The ratio of the V-direction size of the pixel array 11 to the H-direction size thereof is referred to as the aspect ratio of the displayed image. A main reason why the V-direction size of the pixel array 11 is made smaller than the H-direction size thereof is that a small vertically driven pixel-row count is advantageous to improvement of the frame rate.

FIG. 7 is a model diagram showing how the lens group 51 converges incident light toward the pixel array 11 represented by its cross sections spread in the H (horizontal) and V (vertical) directions.

As shown in FIG. 7, the V-direction size of the pixel array 11 is smaller than the H-direction size thereof. Thus, the following relation holds true: h>v. In this relation, reference symbol h denotes the incidence angle on each H-direction edge of the pixel array 11 whereas reference symbol v denotes the incidence angle on each V-direction edge of the pixel array 11. It is to be noted that the incidence angle v on each V-direction edge of the pixel array 11 and the incidence angle h on each H-direction edge of the pixel array 11 can be expressed by the following equations as follows:

Incidence angle $v=\tan((V/2)/D)$

Incidence angle $h=\tan((H/2)/D)$

In the above equations, reference symbol V denotes the V-direction size of the pixel array 11 whereas reference symbol H denotes the H-direction size of the pixel array 11. On the other hand, reference symbol D denotes the distance between the focal point of the lens group 51 and the pixel array 11.

The row scan direction (also referred to simply the scan direction) cited before is the V direction mentioned above. Normally, the start pixel row is positioned on a V-direction edge of the pixel array 11. An operation to scan pixel rows on the pixel array 11 is begun at the start pixel row in the V direction toward the center pixel row. The operation to scan pixel rows on the pixel array 11 is carried out sequentially on a one-row-after-another basis. The operation to scan pixel rows on the pixel array 11 is terminated at the end pixel row which is positioned on a V-direction edge of the pixel array 11. Thus, the farther the scanned pixel row from the center pixel row, the larger the incidence angle. In other words, the closer the scanned pixel row to the start or end pixel row, the larger the incidence angle. That is to say, due to these differences in incidence angle, the quantity of light incident to the opto-electric conversion section in the periphery of the pixel array 11 is small in comparison with the quantity of light incident to the opto-electric conversion section at the center of the pixel array 11. Thus, the optical sensitivities of unit pixels in the periphery of the pixel array 11 decrease but the noise quantities of unit pixels in the periphery of the pixel array 11 increase as described as follows.

The noise quantity of a unit pixel in the periphery of the pixel array 11 increases mainly because of a first reason described as follows. The incidence angle of light hitting the unit pixel in the periphery of the pixel array 11 is large. At a large incidence angle, the light directly hits the electric-charge holding section shielded against light and is subjected to an opto-electric conversion process in the electric-charge holding section. Thus, the amount of electric charge generated in the opto-electric conversion process also rises as well. The noise quantity of a unit pixel in the periphery of the pixel array 11 increases also because of a second reason described as follows. The number of components obtained as a result of the opto-electric conversion process carried out outside the opto-electric conversion section increases, raising the probability that electric charge obtained as a result of the opto-electric conversion process is diffused from the location of the opto-electric conversion process to the electric-charge holding section.

Figure 8:
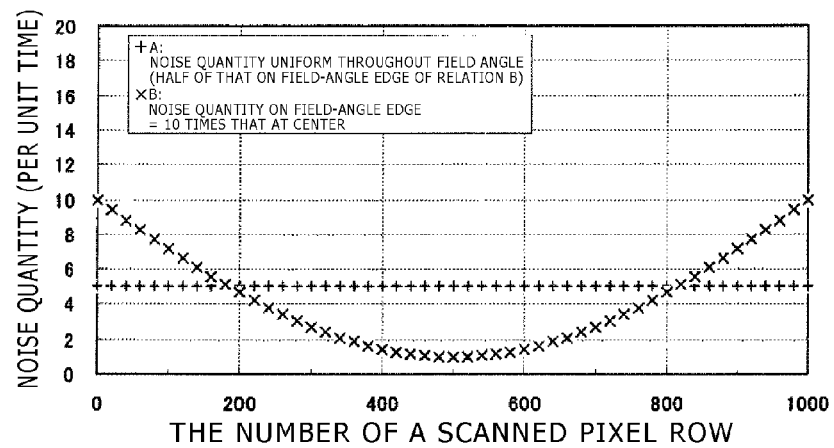
FIG. 8 is a correlation diagram showing the relation shown in FIG. 3 and another relation obtained by re-plotting the relation of FIG. 3 by taking the incidence angle of light into consideration.
Figure 9:
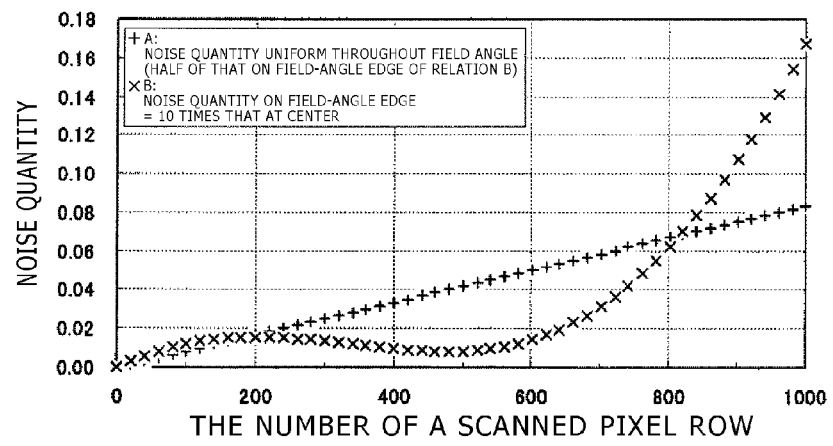
FIG. 9 is a correlation diagram showing the relation shown in FIG. 4 and another relation obtained by re-plotting the relation of FIG. 4 by taking the incidence angle of light into consideration.

FIG. 8 is a correlation diagram showing the relation shown in FIG. 3 and another relation obtained by re-plotting the relation shown in FIG. 3 by taking the incidence angle of light into consideration whereas FIG. 9 is a correlation diagram showing the relation shown in FIG. 4 and another relation obtained by re-plotting the relation shown in FIG. 4 by taking the incidence angle of light into consideration. In each of FIGS. 8 and 9, the relation obtained by not taking the incidence angle of light into consideration is shown as a plot A whereas the relation obtained by taking the incidence angle of light into consideration is shown as a plot B. In each of FIGS. 8 and 9, the plot B is superposed on the plot A.

Much like FIGS. 3 to 5, the X axes of FIGS. 8 and 9 represent a number assigned to the pixel row. The Y axis of FIG. 8 represents the noise quantity per unit time which is 1 second in this case. The incidence angle for the 500th pixel row serving as the center pixel row of the 1,000 pixel rows arranged in the V direction is 0 degrees. Thus, the noise quantity on the 500th pixel row is smallest, being set at 1. As the number assigned to the pixel row decreases or increases toward the numbers assigned to pixel rows in the periphery of the pixel array 11, the noise quantity rises in accordance with a quadratic curve to reach the largest value at the 1st pixel row serving as the start pixel row and the 1,000th pixel row serving as the end pixel row.

In general, the noise quantity per unit time on the center pixel line differs from that on a peripheral pixel line by at least one order of magnitude. Thus, since the noise quantity per unit time on the center pixel row is set at 1, the noise quantity per unit time on a peripheral pixel row can be assumed to have a value of 10. It is to be noted that, as a matter of course, due to the structure of the unit pixel and/or the optical structure of the lens group 51 included in the configurations shown in FIGS. 6 and 7, there is a good chance that the noise quantity per unit time on the start pixel row is different from that on the end pixel row. In addition, there is also a good chance that the noise quantity per unit time on the center pixel row is not smallest.

It is to be noted that, in the relations shown in FIG. 8, the noise quantity per unit time for the plot A has a value of 5 which is approximately the average of the largest noise quantity of 10 per unit time and the smallest noise quantity of one per unit time for the plot B.

The plot B shown in FIG. 8 represents a relation between the noise quantity per unit time of 1 second and the number assigned to the pixel row whereas the plot B shown in FIG. 9 represents a relation between the quantity of the noise actually accumulated during the electric-charge holding period of a pixel row and the number assigned to the pixel row. The plot B shown FIG. 9 is obtained from the plot B shown in FIG. 8.

As shown by the plot B of FIG. 8, in the early part of the row scan operation, the noise quantity per unit time is large. In the early part of the row scan operation, however, the electric-charge holding period is short. Thus, in the early part of the row scan operation, the quantity of the noise actually accumulated during the electric-charge holding period is not so large as shown by the plot B of FIG. 9.

In the middle part of the row scan operation, the noise quantity per unit time is small as shown by the plot B of FIG. 8 even though the electric-charge holding period becomes relatively longer. Nevertheless, in the middle part of the row scan operation, the quantity of the noise actually accumulated during the electric-charge holding period is still not so large as shown by the plot B of FIG. 9.

A problem is raised in the later part of the row scan operation as follows. In the later part of the row scan operation, the noise quantity per unit time is again large as shown by the plot B of FIG. 8 and, in addition, the electric-charge holding period becomes longer. Thus, in the later part of the row scan operation, the quantity of the noise actually accumulated during the electric-charge holding period is undesirably very large as shown by the plot B of FIG. 9.

Figure 2:
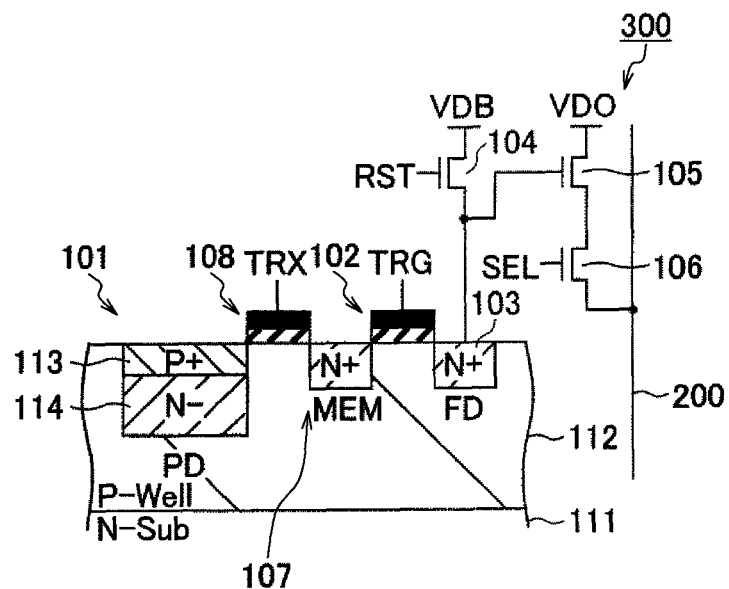
FIG. 2 is a diagram showing the configuration of a unit pixel including a memory section in accordance with an existing technology.

As described above, in a unit pixel implementing a global exposure operation by making use of the floating diffusion capacitor FD as the electric-charge holding section as is the case with the unit pixel 100 shown in FIG. 1 or making use of the memory section 107 as the electric-charge holding section as is the case with the unit pixel 300 shown in FIG. 2, it has been discovered that, during the period of holding electric charge in the floating diffusion capacitor FD or the memory section 107, noise is cumulatively added undesirably to the electric charge with the lapse of time. This noise is generated in accordance with the same principle as the smear noise of the CCD sensor. In addition, it has also been discovered a characteristic indicating that, as shown by the plot B of FIG. 8, the quantity of the noise held in the electric-charge holding section per unit time on each of the scan-direction start pixel row and scan-direction end pixel row is large whereas the quantity of the noise held in the electric-charge holding section per unit time on a scan-direction middle pixel row is smallest.

The noise includes mainly a noise of a first kind and a noise of a second kind. The noise of the first kind is a noise generated as a result of an opto-electric conversion process carried out by the electric-charge holding section such as the floating diffusion capacitor FD or the memory section 107 to convert light incident directly to the electric-charge holding section. The noise of the second type is electric charge originating from the opto-electric conversion section or a source other than the opto-electric conversion section and flowing undesirably to the electric-charge holding section in a diffusion process.

System Configuration

Figure 10:
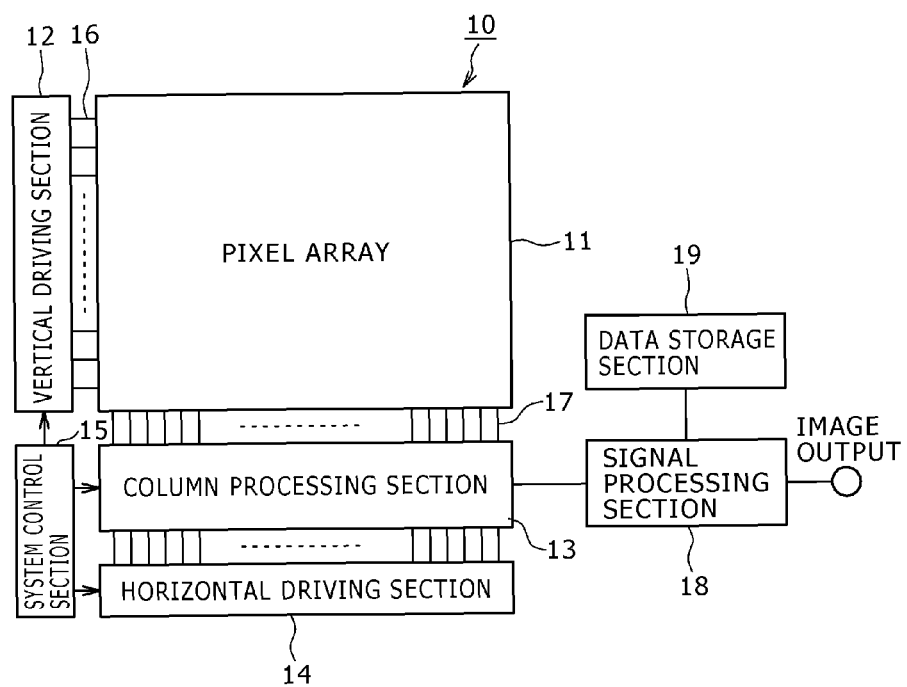
FIG. 10 is a diagram showing the system configuration of a CMOS image sensor according to an embodiment.

FIG. 10 is a diagram showing the system configuration of a CMOS image sensor 10 serving as a solid-state image taking device according to the first embodiment of the present invention. This system configuration is also adopted by embodiments other than the first embodiment.

As shown in FIG. 10, the CMOS image sensor 10 according to the embodiment of the present invention is configured to employ a pixel array 11 created on a semiconductor substrate (or chip) not shown in the figure and a peripheral circuit integrated on the same substrate as the pixel array 11. The peripheral circuit typically includes a vertical driving section 12, a column processing section 13, a horizontal driving section 14 and a system control section 15.

The CMOS image sensor 10 is further provided with a signal processing section 18 and a data storage section 19. The signal processing section 18 and the data storage section 19 can be implemented as an external signal processing section created on a substrate other than the semiconductor substrate of the CMOS image sensor 10. A typical example of the external signal processing section is a DSP (Digital Signal Processor). The external signal processing section can also be implemented by carrying out processing based on hardware and software for controlling the hardware which is typically the hardware of a DSP or a CPU (Central Processing Unit). The external signal processing section normally employs memory means for implementing the data storage section 19.

It is to be noted that the external signal processing section can also be created on the same semiconductor substrate as the CMOS image sensor 10.

The pixel array 11 is configured to include unit pixels laid out in row and column directions to form a 2-dimensional pixel matrix. In the following description, the unit pixel is also referred to as simply as a pixel in some cases. Each of the unit pixels employs an opto-electric conversion element for converting light incident to the element into opto-electric charge also referred to hereafter as signal electric charge or simply as electric charge in some cases. That is to say, the opto-electric conversion element is an element for generating opto-electric charge having an amount proportional to the quantity of the light incident to the element. The generated opto-electric charge is accumulated in the opto-electric conversion element.

The basic cross section (and the circuit configuration) of this unit pixel can be made the same as those shown in FIG. 2 or can be partially modified as will be described later. The shape of a planar pattern of the unit pixel will be described later.

In the pixel array 11, a pixel driving line 16 is created in the horizontal direction of the figure for every pixel row of the pixel matrix which is a 2-dimensional array of unit pixels. The horizontal direction is the row direction in which every pixel row is oriented. In addition, a vertical signal line 17 is created in the vertical direction of the figure for every pixel column of the pixel matrix. The vertical direction is the column direction in which every pixel column is oriented. FIG. 10 shows only one pixel driving line 16 per pixel row. In actuality, however, every pixel row is not necessarily provided with only one pixel driving line 16. That is to say, every pixel row can also be provided with a plurality of pixel driving lines 16. For example, as shown in FIG. 2, every pixel row is provided with two pixel driving lines 16, i.e., a reset line for supplying a reset pulse RST to the gate electrode of the reset transistor 104 and a select line for supplying a select pulse SEL to the gate electrode of the select transistor 106. In this invention specification, the select line is also referred to as a scan line.

One end of the pixel driving line 16 is connected to an output terminal of the vertical driving section 12. The output terminal of the vertical driving section 12 is associated with a pixel row for which the pixel driving line 16 is provided.

The vertical driving section 12 is configured to include components such an address decoder and a shift register. The vertical driving section 12 is a pixel driving section for driving the unit pixels of the pixel array 11 at the same time in certain units each of which can be typically a pixel area determined in advance or a pixel row. In the case of this embodiment, the vertical driving section 12 drives all the unit pixels of the pixel array 11 at the same time.

A concrete configuration of the vertical driving section 12 is not shown in the figure. In general, however, the vertical driving section 12 is configured to include two scan systems, i.e., a read scan system and a sweep scan system. Each of the read scan system and the sweep scan system is a circuit for individually driving the scan lines of the pixel rows on a one-row-after-another basis. A typical example of the scan line is the select line for supplying a select pulse SEL to the gate electrode of the select transistor 106 as shown in FIG. 2.

In order to read out signals from unit pixels in the pixel array 11, the read scan system sequentially scans and selects the unit pixels in row units in a read scan operation. The sweep scan system carries out a sweep scan operation on a pixel row to be subjected to a read scan operation carried out by the read scan system. The sweep scan operation leads ahead of the read scan operation by a time the length of which is determined by the speed of a shutter. The read scan operation is carried out by the read scan system synchronously with the sweep scan operation carried out by the sweep scan system in accordance with control based on a clock signal.

The sweep scan operation carried out by the sweep scan system sweeps (or resets) unnecessary electric charge from an opto-electric conversion element employed in a unit pixel being subjected to the sweep scan operation, resetting the opto-electric conversion element.

The sweep scan system sweeps (or resets) unnecessary electric charge in order to carry out the so-called electronic shutter operation. The electronic shutter operation is an operation to discard opto-electric charge of the opto-electric conversion element such as the photodiode 101 employed in the unit pixel 300 shown in FIG. 2 and newly start an exposure operation, that is, newly start an operation to accumulate opto-electric charge.

As is obvious from the above description, in the case of the unit pixel 300 shown in FIG. 2 for example, the reset transistor 104 is driven by the sweep scan system.

A signal read out from an opto-electric conversion element employed in a unit pixel in a read operation carried out by the read scan system has a magnitude determined by the quantity of incident light hitting the opto-electric conversion element during the immediately preceding read operation or hitting the opto-electric conversion element since the electronic shutter operation. In the case of the unit pixel 300 shown in FIG. 2 for example, the select transistor 106 is driven by the read scan system. A period between the read timing of the immediately preceding read operation or the sweep timing of the electronic shutter operation and the read timing of the present read operation is referred to as the period of accumulation of opto-electric charge in the unit pixel. In the following description, the period of accumulation of opto-electric charge is referred to as an exposure period.

Signals read out from unit pixels on a pixel row selected and scanned by the vertical driving section 12 are supplied to the column processing section 13 for each pixel column through the vertical signal line 17 corresponding to the vertical signal line 200 connected to the unit pixel 300 as shown in FIG. 2.

The column processing section 13 carries out signal processing determined in advance on signals output by unit pixels on the selected pixel row of the pixel array 11 through the vertical signal lines 17 for every pixel column and stores signals obtained as a result of the signal processing temporarily in an internal memory.

To put it concretely, the signal processing carried out by the column processing section 13 includes at least noise elimination processing such as CDS (Correlated Double Sampling) processing. By carrying out the CDS processing, the column processing section 13 is capable of eliminating reset noises and fixed pattern noises caused by, among others, variations of the threshold voltage of the amplification transistor 105 as noises inherent in the unit pixel. In addition to the function to eliminate such noises, the column processing section 13 is also provided with typically an AD (analog-to-digital) conversion function to convert the analog input signal into an output digital signal.

The horizontal driving section 14 is also configured to include components such an address decoder and a shift register. The horizontal driving section 14 sequentially selects unit circuits each employed in the column processing section 13 as a circuit corresponding to a pixel column. The horizontal driving section 14 selects and scans the unit circuits in order to sequentially supply a signal completing the signal processing carried out by the column processing section 13 for every unit circuit to the signal processing section 18.

It is to be noted that the shift register employed in the horizontal driving section 14 may be configured to allow conversion scan processing to convert input parallel pixel data representing signal electric charge into output serial pixel data or into an output consisting of bits the number of which is determined in advance. In this case, an AD converter may be connected to the output terminal of the shift register.

The system control section 15 is configured to include a timing generator for generating a variety of timing signals. The system control section 15 controls operations to drive sections such as the vertical driving section 12, the column processing section 13 and the horizontal driving section 14 on the basis of the timing signals generated by the timing generator.

The signal processing section 18 has at least an addition processing function to be executed for carrying out various kinds of signal processing including addition processing on a pixel signal output by the column processing section 13. A purpose of the addition processing is elimination of random noises caused by an averaging process. Another purpose of the addition processing is addition.

The data storage section 19 is used for temporarily storing data required in the signal processing carried out by the signal processing section 18. The signal processing may not require data to be stored temporarily in a memory in some cases. In such cases, the data storage section 19 can be omitted.

Pixel Structures and Layouts

The structures of the unit pixel and the layouts thereof are explained by referring to FIGS. 11A to 17.

Figure 11A:
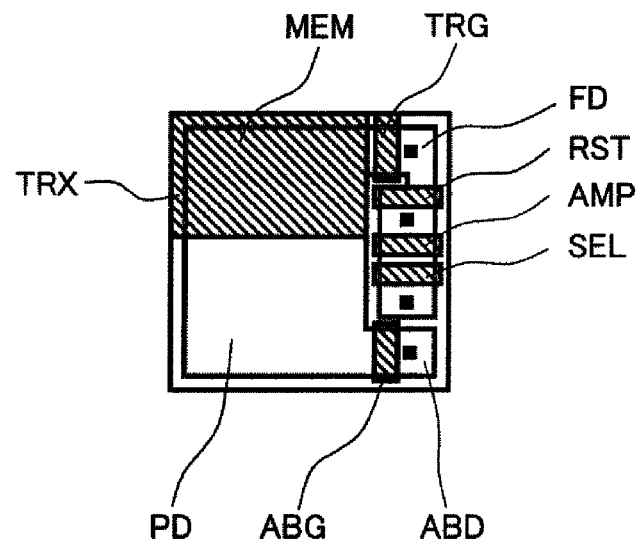
FIGS. 11A and 11B are a plurality of top-view diagrams showing the configuration of a unit pixel according to a first embodiment.
Figure 11B:
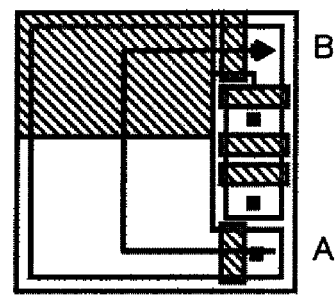
Figure 12:
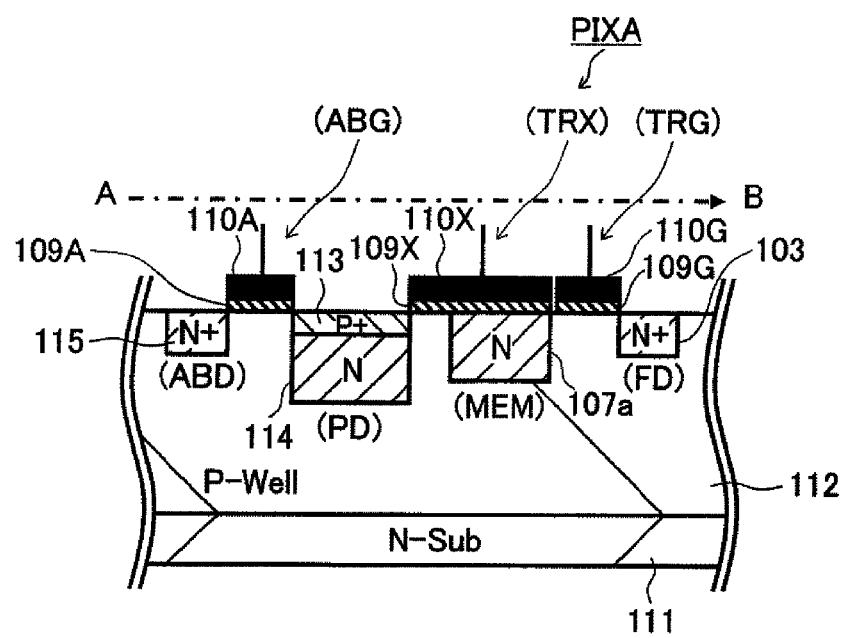
FIG. 12 is a cross-sectional diagram showing the structure of the unit pixel according to the first embodiment.

FIG. 11A is a top-view diagram showing a structure of the unit pixel. FIG. 12 is a cross-sectional diagram showing the cross section of the pixel unit along a line A-B shown in FIG. 11B. FIGS. 11A and 11B show the same top-view pattern. In the following description, FIG. 11A showing a variety of reference numerals and reference symbols is referred to.

First of all, a cross-sectional structure of the unit pixel is explained by referring to FIG. 12.

Much like the unit pixel 300 shown in FIG. 2, the unit pixel PIXA shown in FIG. 12 is typically constructed in the P-type well layer 112 created on the N-type semiconductor substrate 111. In the case of this embodiment, the semiconductor substrate 111 is a silicon substrate.

Much like the unit pixel 300 shown in FIG. 2, in the P-type well layer 112, an opto-electric conversion section PD is created. The opto-electric conversion section PD has a P+-type hole accumulation layer 113 on the surface side of the P-type well layer 112 and the N-type embedded layer 114 on the inner side of the P-type well layer 112. The P+-type hole accumulation layer 113 corresponds to the P-type layer 113 employed in the unit pixel 300 shown in FIG. 2. On one side of the opto-electric conversion section PD, a first transfer gate transistor and a second transfer gate transistor are created, being connected to each other in series. The first transfer gate transistor has a circuit function equivalent to that of the transfer gate transistor 108 employed in the unit pixel 300 shown in FIG. 2 whereas the second transfer gate transistor has a circuit function equivalent to that of the transfer gate transistor 102 employed in the unit pixel 300 shown in FIG. 2.

In the following description as well as FIGS. 11A and 11B and subsequent figures, reference symbol TRX denotes a first transfer gate which is the gate electrode of the first transfer gate transistor whereas reference symbol TRG denotes a second transfer gate which is the gate electrode of the second transfer gate transistor. In addition, reference symbol TRX is also used for denoting a pulse signal applied to the gate electrode of the first transfer gate transistor whereas reference symbol TRG is also used for denoting a pulse signal applied to the gate electrode of the second transfer gate transistor.

The first transfer gate TRX also denoted by reference numeral 110X is placed to cover the surface of an area separating a semiconductor area forming the opto-electric conversion section PD and the N-type area 107a of the memory section 107 also denoted by reference symbol MEM from each other. As described earlier, the opto-electric conversion section PD has the P+-type hole accumulation layer 113 and the N-type embedded layer 114. In addition, the first transfer gate TRX also covers the surface of the N-type area 107a itself. A gate insulation film 109X is provided between the first transfer gate TRX and these covered surfaces which are a part of the surface of the P-type well layer 112 created on the semiconductor substrate 111.

The impurity profile of the memory section MEM in the substrate depth direction has the face of a junction between the memory section MEM and the P-type well layer 112 created on the semiconductor substrate 111 at a position which is shallow in comparison with the face of a junction between the opto-electric conversion section PD and the P-type well layer 112. In the following description, the position at which the face of the junction is placed is referred to simply as a junction position.

The opto-electric conversion section PD employed in the CMOS image sensor receives light having a variety of large wavelengths in a range up to a small wavelength of 700 nm in the red color region. Thus, the opto-electric conversion section PD has to be an area which is sensitive to the depth of about 3 μm.

On the other hand, the memory section MEM is used for eliminating noises including the smear noises described earlier as main components. Thus, it is nice to prevent light incident to the opening of the opto-electric conversion section PD in an inclined direction from directly hitting the memory section MEM. To put it concretely, it is desirable to have a narrowest possible face of the junction and a shallowest possible junction position which satisfy other characteristics such as the amount of electric charge that can be accumulated. Thus, the junction position of an N-type area 107a forming the memory section MEM is made shallow in comparison with the junction position of the N-type area 103 forming the opto-electric conversion section PD.

The second transfer gate TRG also denoted by reference numeral 110G is placed to cover the surface of an area separating the N-type area 107a of the memory section 107 and the N-type area 103 serving as the floating diffusion capacitor FD from each other. A gate insulation film 109G is provided between the second transfer gate TRG and the covered surface which is also a part of the surface of the P-type well layer 112.

The N-type area 103 serving as the floating diffusion capacitor FD is created in an area included in the P-well layer 112 as an area adjacent to the second transfer gate TRG. In the same way as the unit pixel 300 shown in FIG. 2, the floating diffusion capacitor FD is typically connected to a read section including the reset transistor 104, the amplification transistor 105 and the select transistor 106. The reader is advised to keep in mind that it is also possible to provide a configuration in which the select transistor 106 is placed between the line supplying the voltage Vdd and the amplification transistor 105 to serve as a switch for connecting the amplification transistor 105 to the line or disconnecting the amplification transistor 105 from the line. It is also to be noted that this configuration can be adopted as well in the unit pixel 300 shown in FIG. 2.

The unit pixel PIXA shown in FIG. 12 also includes an electric-charge exhausting drain ABD even though the electric-charge exhausting drain ABD is not an absolutely required element.

The electric-charge exhausting drain ABD is an N+-type area 115 created on the P-type well layer 112 separately from the opto-electric conversion section PD. On a substrate area between the opto-electric conversion section PD and the electric-charge exhausting drain ABD, an electric-charge exhausting gate ABG is created, being separated from the substrate area by a gate insulation film 109A.

Each of the opto-electric conversion section PD and the memory section MEM is created at an impurity concentration causing a depletion state at an electric-charge exhausting time. On the other hand, each of the floating diffusion capacitor FD and the electric-charge exhausting drain ABD is created at an impurity concentration higher than the impurity concentration causing the depletion state so as to allow its wire contact to be connected electrically.

Figure 13:
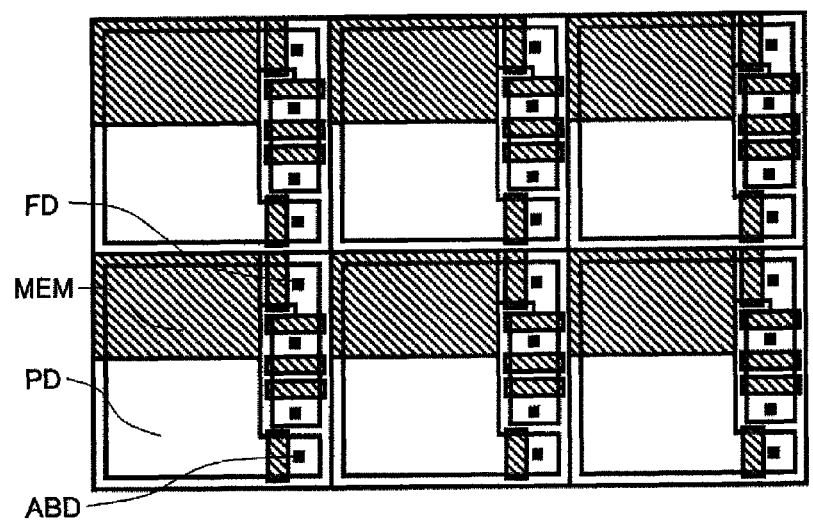
FIG. 13 is a top-view diagram showing the basic configuration of a pixel array according to the first embodiment.

FIG. 13 is a top-view diagram showing the basic configuration of a pixel array section including unit pixels PIXA laid out to form a matrix. This pixel array section is a part of the pixel array 11 employed in the CMOS image sensor 10 shown in FIG. 10. The basic configuration of the pixel array section includes 6 unit pixels PIXA each having the pattern shown in FIGS. 11A and 11B.

As will be described later in detail, in this layout, a group of unit pixels arranged horizontally in the row direction is taken as one row unit used in the operation carried out by the pixel driving line 16 to drive unit pixels.

In addition, the pixel array 11 according to the first embodiment does not include a shared unit pixel. Thus, the pixel array 11 has a structure capable of implementing a global shutter driving operation to hold signal electric charge in not only the memory section MEM but also the floating diffusion capacitor FD.

Figure 14:
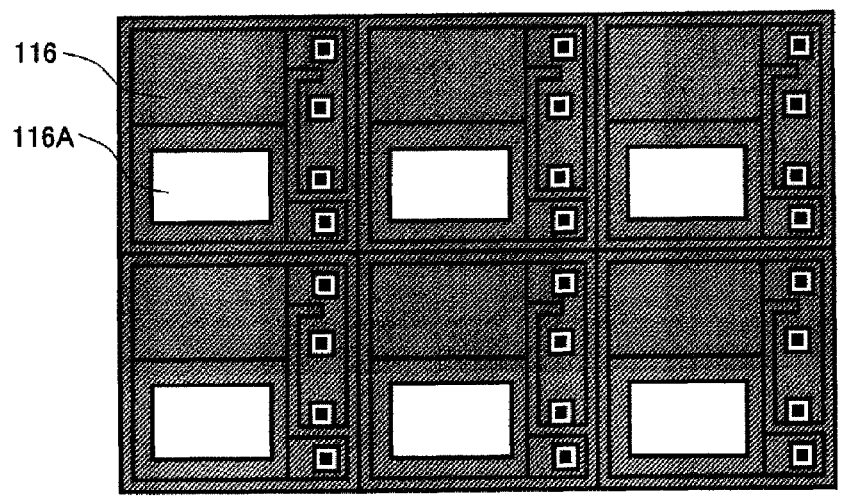
FIG. 14 is a top-view diagram showing a layout of field shielding films for shielding the basic configuration of the pixel array 11 shown in FIG. 13 against light and a layout of PD openings.

FIG. 14 is a top-view diagram showing a layout of field shielding films 116 for shielding the basic configuration of the pixel array 11 shown in FIG. 13 against light and a layout of PD openings 116A each provided for one of the light shielding films 116. In order to simplify FIG. 14, the gate electrodes shown in FIGS. 11A and 11B are omitted and, thus, FIG. 14 shows the films 116 each including a PD opening 116A, active areas and contact portions only. In FIG. 14, a contact portion is a small portion provided at a location outside of the PD opening 116A of the light shielding film 116. The contact portion is shown as a black rectangular portion which can be visualized from, for example, a rectangular contact opening. The active area having a contour with a size smaller than the unit pixel can be seen from the light shielding film 116. The active area is a portion having a pattern determined in advance in a transistor area provided with the contact portion to serve as a read section.

The light shielding film 116 is created on the upper layer of the gate electrode, sandwiching an insulation film between the light shielding film 116 and the upper layer. The light shielding film 116 is created by patterning a film such as an Al film or a film having a high melting point. Typical examples of the film having a high melting point are a tungsten film, a molybdenum film and a tantalum film.

In order to let light hit the opto-electric conversion section PD, the light shielding film 116 has the PD opening 116A provided right above the opto-electric conversion section PD.

The PD opening 116A by no means covers all the area of the opto-electric conversion section PD. If the size of the PD opening 116A is increased, the optical sensitivity of the opto-electric conversion section PD is enhanced. However, noise components (that is, electric charge other than signal electric charge) incident to electric-charge holding sections also undesirably increase as well. In this case, the electric-charge holding sections include the N-type area 107a of the memory section 107 also referred to as the memory section MEM and the N-type area 103 serving as the floating diffusion capacitor FD.

Thus, normally, light shielding edges are determined in order to assure sufficient light shielding overlaps for shielding the electric-charge holding sections against light. For example, the size of the PD opening 116A is made a little bit smaller than those of the N-type embedded layer 114 and the P-type layer 113 which together form the opto-electric conversion section PD. Thus, the edge of the light shielding film 116 cover bump-side surfaces of the first transfer gate TRX and the electric-charge exhausting gate ABG. As a result, it is possible to prevent inclined incident light from propagating to locations close to the electric-charge holding sections such as the N-type area 107a. This technique of avoiding inclined incident light is applied in the same way to a location at which a bump created by a gate electrode exists.

In order to prevent the light shielding film 116 from being shortened to the contact portion, the light shielding film 116 is separated away from the contact portion and the surroundings of the contact portion. FIG. 14 shows a contact opening of only a contact portion on the active area in which components such as the electric-charge exhausting drain ABD and the floating diffusion capacitor FD are created. In actuality, however, there is a contact portion also on every gate electrode. It is thus necessary to provide a contact opening for such a contact portion. The larger the size of a contact portion and the larger the number of contact portions, the larger the quantity of leak light and the larger the number of noises.

Figure 15:
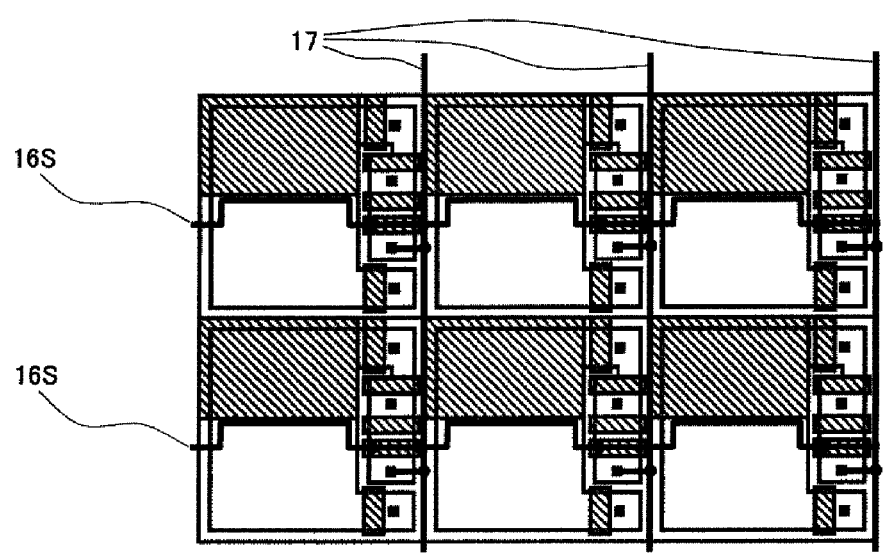
FIG. 15 is a top-view diagram showing the pixel array shown in FIG. 13 and a variety of signal lines.

FIG. 15 is a top-view diagram showing the pixel array 11 shown in FIG. 13, vertical signal lines 17 and SEL driving signal lines 16S which are each a pixel driving line 16.

The vertical signal line 17 is created as a 1st-layer wire (1MT) and connected to the output portions of SF (source follower) circuits of unit pixels laid out in the column direction to form a pixel column. In the case of the unit pixel 300 shown in FIG. 2, the output portion of an SF (source follower) circuit of the unit pixel 300 is the source pertaining to the select transistor 106 to serve as an electrode on the side opposite to the amplification transistor 105.

The SEL driving signal lines 16S is created as a 2nd-layer wire (2MT) and connected to the gate electrodes, which pertain to SEL transistors of unit pixels laid out in the row direction to form a pixel row, through the 1MT and a contact portion. In the case of the unit pixel 300 shown in FIG. 2, this SEL transistor is the select transistor 106.

Let attention be paid to the SEL driving signal lines 16S (i) provided for the ith pixel row and the SEL driving signal lines 16S (i+1) provided for the (i+1)th pixel row. In this case, first of all, the SEL driving signal lines 16S (i) is driven in order to output a signal from the ith pixel row. Then, the SEL driving signal lines 16S (i+1) is driven in order to output a signal from the (i+1)th pixel row. The driving direction from the SEL driving signal lines 16S (i) to the SEL driving signal lines 16S (i+1) is referred to as the scan direction which is the direction of the scan operations. On the other hand, the order of the scan operations carried out on the SEL driving signal lines 16S (i) and, then, the SEL driving signal lines 16S (i+1) is referred to as the scan order.

Figure 16:
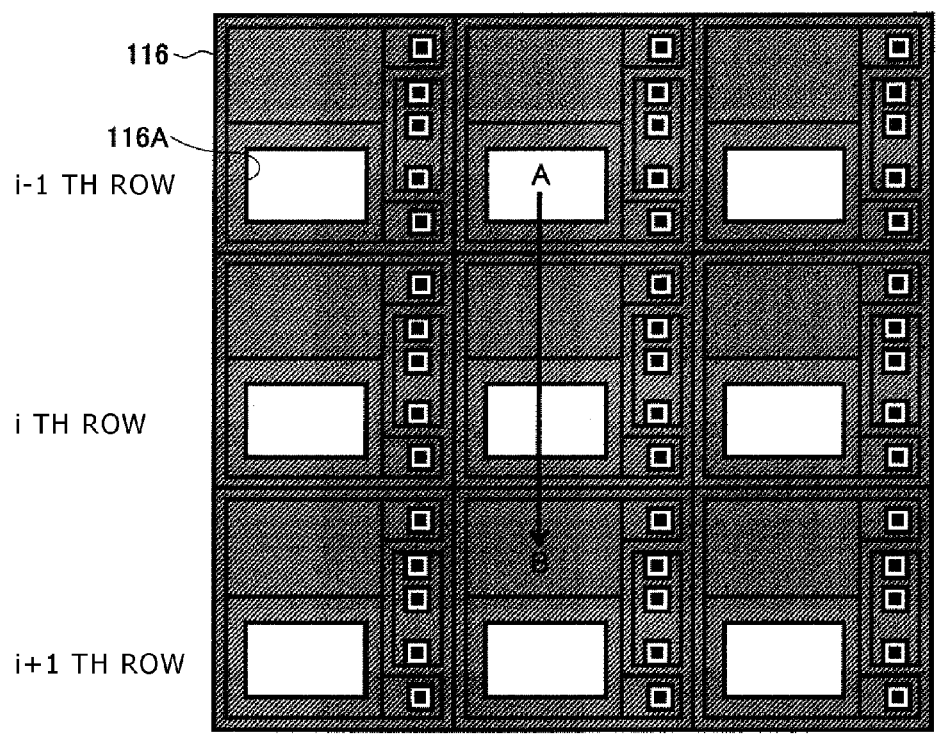
FIG. 16 is a top-view diagram showing the basic configuration of the pixel array for three scanned pixel rows.

FIG. 16 is a top-view diagram showing the basic configuration of the pixel array 111 for three scanned pixel rows each including light shielding films 116 and PD openings 116A. In this case, the driving direction from the SEL driving signal lines 16S (i−1) to the SEL driving signal lines 16S (i+1) through the SEL driving signal lines 16S (i) is referred to as the scan direction which is the direction of the scan operations. On the other hand, the order of the scan operations carried out on the SEL driving signal lines 16S (i−1), then, the SEL driving signal lines 16S (i) and, then, the SEL driving signal lines 16S (i+1) is referred to as the scan order.

With regard to the scan direction, the relation between the physical positions of the opto-electric conversion section PD and the electric-charge holding section which are employed in one unit pixel is defined as follows. The electric-charge holding section is said to be on the scan-direction upstream side of the opto-electric conversion section PD. The scan-direction upstream side or the upstream side in the scan direction is a side on which the scan operation is started. On the other hand, the downstream side in the scan direction or the scan-direction downstream side to be described later is a side on which the scan operation is ended.

In this case, the electric-charge holding section is the N-type area 107a of the memory section MEM employed in the unit pixel PIXA shown FIG. 12 or the N-type area 103 of the floating diffusion capacitor FD employed in the same unit pixel PIXA. As described earlier, the light shielding film 116 not shown in FIG. 12 covers the N-type area 107a of the memory section MEM and the N-type area 103 of the floating diffusion capacitor FD. On the other hand, most of the opto-electric conversion section PD is open to incident light coming through the PD opening 116A. Thus, in one unit pixel included in the pixel array 11 shown in FIG. 16, if the read section including 5 contact portions laid out vertically is excluded, about lower-side half of the unit pixel is an area occupied by the opto-electric conversion section PD and located on the scan-direction downstream side defined above. In addition, the upper half of the unit pixel is an area occupied by the electric-charge holding section and located on the scan-direction upstream side defined above.

Figure 17:
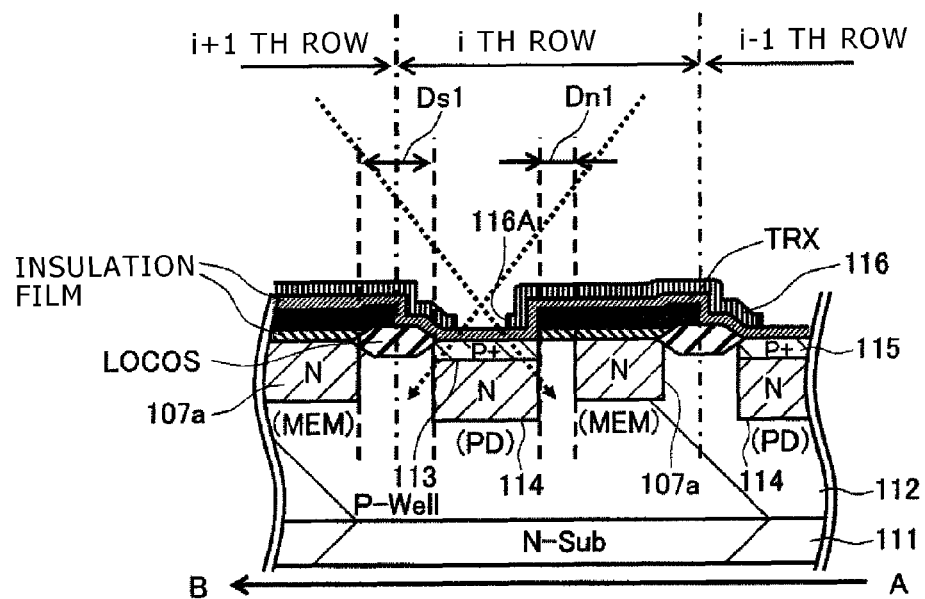
FIG. 17 is a cross-sectional diagram showing a structure along a line A-B shown in FIG. 16.

FIG. 17 is a cross-sectional diagram showing a structure along a line A-B shown in FIG. 16.

FIG. 17 shows a unit pixel on the ith pixel row at the center of the figure, a portion of a unit pixel on the (i−1)th pixel row on the right side of the figure and a portion of a unit pixel on the (i+1)th pixel row on the left side of the figure. The unit pixels are separated and insulated electrically from each other by an element separation layer prescribing an active layer mentioned before. In the structure shown in the figure, the element separation layer is a LOCOS layer. However, it is possible to employ an element separation layer of another type. Typical examples of the element separation layer of another type are the STI, EDI and FLAT element separation layers.

The distance Dn1 between the opto-electric conversion section PD on the ith pixel row and the memory section MEM located on the same ith pixel row to serve as the memory section MEM on the upstream side in the scan direction is shorter than the distance Ds1 between the same opto-electric conversion section PD and the memory section MEM located on the (i+1)th pixel row on the downstream side in the scan direction. The distance Dn1 is a distance between an opto-electric conversion section PD and a memory section MEM which are employed in the same unit pixel. Thus, the distance Dn1 means the length of a transfer of electric charge from the opto-electric conversion section PD to the memory section MEM. On the other hand, the distance Ds1 is a distance between an opto-electric conversion section PD on a specific pixel row and a memory section MEM on a pixel row adjacent to the specific pixel row. Thus, the distance Ds1 means the width of a gap separating pixel rows adjacent to each other. The reader is advised to keep in mind that it is even more desirable to set the distance Ds1 at a value at least twice the distance Dn1.

The relation between the distances Ds1 and Dn1 holds true for the other photodiodes PD laid out in the column direction.

At the scan-direction upstream end (that is, in the vicinity of the scan start row) in such a structure, incident light coming from a left upper source in FIG. 17 is dominant. At the scan-direction downstream end (that is, in the vicinity of the scan end row) in the structure, on the other hand, incident light coming from a right upper source in FIG. 17 is dominant. That is to say, at the scan-direction upstream end, most of incident light entering the opening of the opto-electric conversion section PD employed in a unit pixel propagates in a direction toward the memory section MEM of the same unit pixel. Conversely, at the scan-direction downstream end, most of incident light entering the opening of the opto-electric conversion section PD employed in a specific unit pixel propagates in a direction toward the memory section MEM of another unit pixel separated away from the specific pixel in the scan-direction downstream direction.

Figure 18:
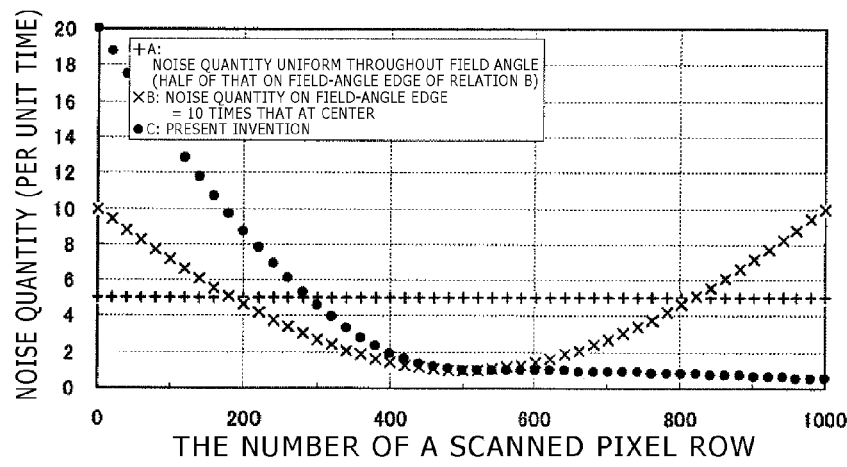
FIG. 18 is a correlation diagram showing the relations shown in FIG. 8 and a relation between the number of a scanned pixel row and the noise quantity per unit time for the first embodiment.
Figure 19:
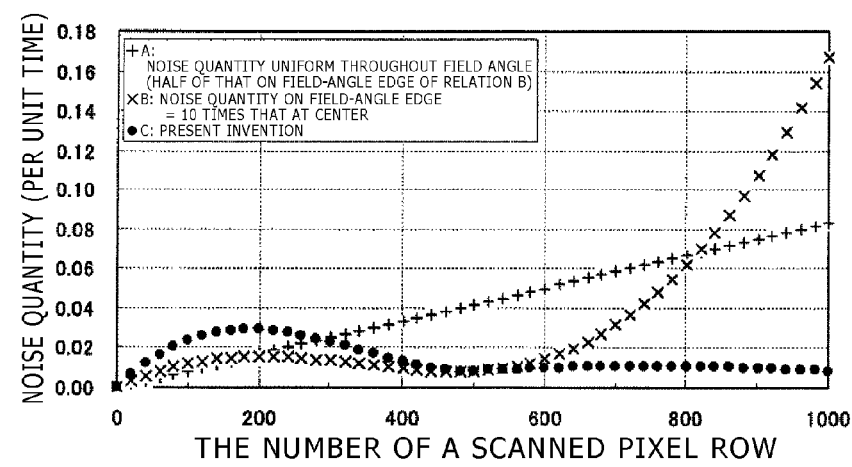
FIG. 19 is a correlation diagram showing the relations shown in FIG. 9 and another relation between the number of a scanned pixel row and the actually accumulated noise quantity for the first embodiment.

Each of FIGS. 18 and 19 shows relations between the number of a scan row and the noise quantity for the first embodiment.

Black circles composing a plot C shown in FIG. 18 represent a relation for a case in which the cross-sectional configuration shown in FIG. 17 as a configuration according to the present invention is applied in the column direction. In addition, FIG. 18 also shows plots A and B shown in FIG. 8 for cases to which the present invention is not applied.

Much like FIG. 8, in FIG. 18, the horizontal axis represents the number assigned to the pixel row whereas the vertical axis represents the noise quantity per unit time which is 1 second in this case. Numbers are each assigned to one of pixel rows which are arranged in the scan direction also referred to as the column direction. A number assigned to a pixel row can be considered as the Y address of unit pixels placed on the pixel row.

In accordance with the present invention, the unit pixel has a structure in which, during the scan-operation first half on the upstream side in the scan direction, most of incident light entering the opening of the opto-electric conversion section PD employed in the unit pixel propagates in a direction toward the memory section MEM of the same unit pixel. Thus, as shown by the plot C representing a relation for the structure according to the present invention, during the first half of the scan operation, the noise quantity per unit time is large in comparison with the plot B provided for the existing structure as a curve obtained by taking the incidence angle of the incident light into consideration. For a number of 0 assigned to the scan-start pixel row, the unit-time noise quantity of the plot C is 20 which is two times the unit-time noise quantity of 10 on the plot B. As described before, the noise quantity per unit time does not have a unit since the noise quantity per unit time is a relative value. As an alternative, the noise quantity per unit time can have any unit.

Conversely, during the scan-operation second half on the downstream side in the scan direction, most of incident light entering the opening of the opto-electric conversion section PD employed in a specific unit pixel propagates in a direction toward the memory section MEM of another unit pixel separated away from the specific pixel in the scan-direction downstream direction. Let the distance Ds1 have a large value which is, for example, at least two times the distance Dn1. In this case, as shown by the plot C, during the second half of the scan operation, the noise quantity per unit time is small and of course smaller than that of the plot B. For a number of 1,000 assigned to the scan-end pixel row, the unit-time noise quantity of the plot C is 0.5 which is half the unit-time noise quantity of 1 on the plot C for a number of 500 assigned to the middle pixel row in the scan operation. As described before, the noise quantity per unit time does not have a unit since the noise quantity per unit time is a relative value. As an alternative, the noise quantity per unit time can have any unit.

It is to be noted that, for every pixel row in the vicinity of the middle pixel row, the unit-time noise quantity indicated by the plot B provided for the existing structure is about equal to the unit-time noise quantity indicated by the plot C provided for the structure according to the present invention.

FIG. 19 shows three curves each representing a relation between the pixel-row number and the actually accumulated noise quantity. The three curves shown in FIG. 19 are found from their respective counterpart curves shown in FIG. 18 as curves each representing a relation between the pixel-row number and the noise quantity per unit time which is 1 second in this case. To put it concretely, the actually accumulated noise quantity is found by integrating the noise quantity per unit time over the electric-charge holding period.

As shown in FIG. 18, in the case of the pixel-row numbers corresponding to the first half of the scan operation, the unit-time noise quantity indicated by the plot C for the structure according to the present invention is greater than that indicated by the plot B for the existing structure. Thus, as shown in FIG. 19, in the case of the pixel-row numbers corresponding to the first half of the scan operation, the actually accumulated noise quantity indicated by the plot C is naturally greater than that indicated by the plot B.

As shown in FIG. 18, in the case of the pixel-row numbers corresponding to the second half of the scan operation, on the other hand, the unit-time noise quantity indicated by the plot C is smaller than that indicated by the plot B. Thus, as shown in FIG. 19, in the case of the pixel-row numbers corresponding to the second half of the scan operation, the actually accumulated noise quantity indicated by the plot C as the noise quantity found by integrating the noise quantity per unit time over the electric-charge holding period is naturally smaller than that indicated by the plot B.

As described above, the plot B shown in FIG. 19 represents a relation for the existing structure. As shown by the plot B, in the case of the existing structure, the actually accumulated noise quantity abruptly increases in the second half of the scan operation.

On the other hand, the plot C shown in FIG. 19 represents a relation for the structure according to the present invention. As shown by the plot C, in the case of the structure according to the present invention, the actually accumulated noise quantity does not abruptly increase in the second half of the scan operation. Thus, it is possible to realize a structure with little noise-quantity unevenness throughout all the pixel rows. The difference between the maximum value of the actually accumulated noise quantity and the minimum value of the actually accumulated noise quantity for the structure according to the present invention is made smaller than that for the existing structure. To put it concretely, the application of the present invention reduces the difference for the structure according to the present invention to a value about equal to $\frac{1}{10}$ of that for the existing structure.

The description given so far has explained a structure in which, in the scan direction, the opto-electric conversion section PD and the memory section MEM are placed alternately and, in each unit pixel, the memory section MEM is located on the scan-direction upstream side of the opto-electric conversion section PD.

In accordance with a higher-level concept of the present invention, however, two opto-electric holding sections (such as the memory sections MEM) of two unit pixels adjacent to each other in the scan direction are placed disproportionately to one of the sides in the scan direction with respect to the opto-electric conversion section PD or an optical-path limiting section.

The two opto-electric holding sections are placed disproportionately to a specific one of the sides in the scan direction with respect to the opto-electric conversion section PD or an optical-path limiting section by typically shifting the center of a gap between the two opto-electric holding sections from the scan-direction center of the opto-electric conversion section PD or the scan-direction center of the optical-path limiting section to the specific side in the scan direction.

Let the opto-electric conversion section PD taken as a reference for example. In this case, as described earlier by referring to FIG. 17, the distance Ds1 between the opto-electric conversion section PD and the memory section MEM on the downstream side in the scan direction is set at a value longer than the distance Dn1 between the opto-electric conversion section PD and the memory section MEM on the upstream side in the scan direction. Thus, it is possible to provide a configuration in which the relation between the opto-electric conversion section PD and the memory section MEM which are employed in the same unit pixel is reversed to a relation opposite to that shown in the figure by placing the opto-electric conversion section PD on the upstream side in the scan direction and the memory section MEM on the downstream side in the scan direction. In the case of this configuration, by setting the distance between the memory section MEM included in a specific unit pixel and the opto-electric conversion section PD included in a unit pixel adjacent to the specific unit pixel at a value longer than the distance between the memory section MEM included in a specific unit pixel and the opto-electric conversion section PD included in the specific unit pixel, the same effects can be obtained.

In this case, however, the condition for setting the mutual separation of elements included in unit pixels adjacent to each other becomes strict and a transfer of electric charge from the opto-electric conversion section PD to the memory section MEM easily becomes difficult to carry out due to the longer distance between the opto-electric conversion section PD and the memory section MEM. In order to reduce the effect on the mutual separation of elements and the easiness of the electric-charge transfer, it is possible to provide configurations in which the relation between the positions of the opto-electric conversion section PD and the electric-charge holding section in the unit pixel shown in each of FIGS. 13 and 17 is reversed by swapping the elements on the upstream and downstream sides in the scan direction with each other.

The descriptions given above can be summed up below. The solid-state image taking device according to the first embodiment exhibits characteristics (1) and (2) as well as effect (3) which are explained as follows.

(1): The opto-electric conversion section PD and the electric-charge holding section are placed alternately in the vertical scan direction.

(2): The relation between the distance from the opto-electric conversion section PD to the electric-charge holding section on the upstream side in the vertical scan direction and the distance from the opto-electric conversion section PD to the electric-charge holding section on the downstream side in the vertical scan direction is described as follows. The distance from the opto-electric conversion section PD to the adjacent electric-charge holding section on the downstream side in the vertical scan direction is longer than the distance from the opto-electric conversion section PD to the adjacent electric-charge holding section on the upstream side in the vertical scan direction.

(3): In this structure, on the scan-start pixel row, incident light having a large incidence angle propagates at a high intensity from the opening of the opto-electric conversion section PD to the electric-charge holding section placed at a relatively short distance from the opto-electric conversion section PD. Conversely, on the scan-end pixel row, incident light having a large incidence angle propagates at a high intensity from the opening of the opto-electric conversion section PD to the electric-charge holding section placed at a relatively long distance from the opto-electric conversion section PD. As a result, it is possible to reduce the difference between the quantity of the noise accumulated during the electric-charge holding period in a unit pixel in the vicinity of the scan-start pixel row having a short electric-charge holding period and the quantity of the noise accumulated during the electric-charge holding period in a unit pixel in the vicinity of the scan-end pixel row having a long electric-charge holding period.

In the first embodiment described above, the noise quantity of the electric-charge holding section is reduced by properly setting a distance between impurity areas in the semiconductor substrate. The first embodiment eliminates noise unevenness generated due to differences between incidence angles of inclined light. Due to the specification of the lens group, however, the number of components included in the inclined incident light may be very large. In such a case or other cases, it may be necessary to prescribe the quantity of the noise intruding into the electric-charge holding section by making use of a relation between a light shielding edge for protection against the incident light and the electric-charge holding section rather than making use of the distance from the opto-electric conversion section PD.

The following description explains two other embodiments each used for prescribing the noise quantity by making use of a distance relation between the light shielding edge and the electric-charge holding section.

In a second embodiment which is a specific one of the two other embodiments, as a member of an incident light path limiting section provided by the present invention, a light shielding film edge is used. In a third embodiment which is the other one of the two other embodiments, the member of the incident light path limiting section is implemented by a wire end. As another member of the incident light path limiting section for limiting inclined incident light, the optical black of a color filter or the like may be assumed. In general, however, the closer the light shielding opening to the substrate, the bigger the effect of the light shielding. Thus, in the case of the second and third embodiments, there are many cases in which it is sufficient to prescribe a range, which is determined by a light shielding film and a wire as a range hit by incident light, by making use of a relation with the electric-charge holding section. It is to be noted that the following description is not to be interpreted as a description limiting a member prescribing a light shielding edge by making use of the incident light path limiting section only to the light shielding film and the wire.

2: Second Embodiment

Figure 20:
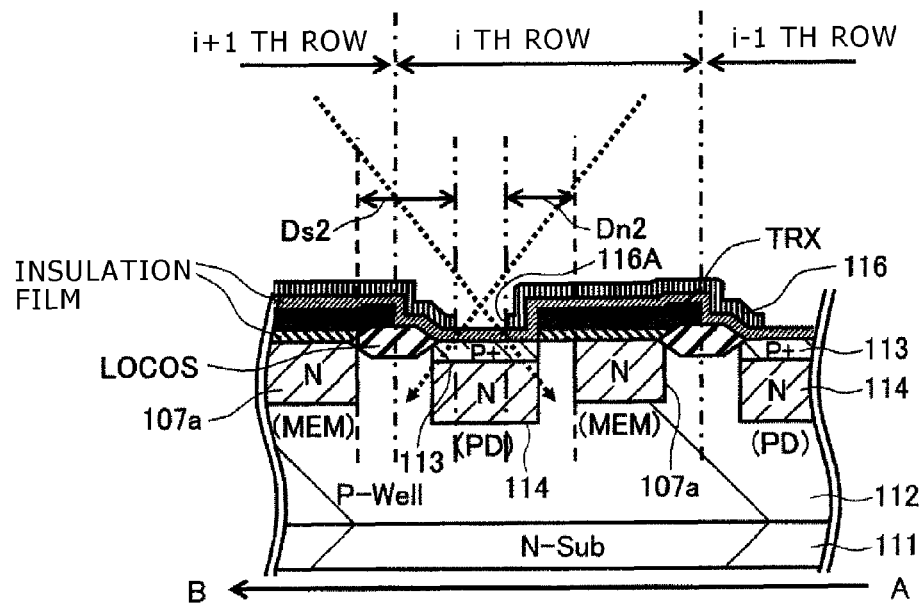
FIG. 20 is a pixel-structure cross-sectional diagram to be referred to in description of a method for prescribing distances in accordance with a second embodiment.

FIG. 20 is a pixel structure cross-sectional diagram referred to in the following description of a method for prescribing distances in accordance with the second embodiment. FIG. 20 is a diagram corresponding to FIG. 17 provided for the first embodiment. That is to say, FIG. 20 is a cross-sectional diagram showing a structure along a line A-B shown in FIG. 16. It is to be noted that FIGS. 10 to 16 provided for the first embodiment can also be applied to the second embodiment.

Much like FIG. 17, FIG. 20 shows a unit pixel on the ith pixel row at the center of the figure, a portion of a unit pixel on the (i−1)th pixel row on the right side of the figure and a portion of a unit pixel on the (i+1)th pixel row on the left side of the figure. The unit pixels are separated and insulated electrically from each other by an element separation layer prescribing an active layer mentioned before. In the structure shown in the figure, the element separation layer is a LOCOS layer. However, it is possible to employ an element separation layer of another type. Typical examples of the element separation layer of another type are the STI, EDI and FLAT element separation layers.

A distance Dn2 is defined as the distance between the N-type area 107a of the memory section MEM to be protected against incoming leak light becoming noises and an edge of a PD opening 116A created on a light shielding film 116 serving as a member of the incident light path limiting section. Also referred to as a light shielding edge, the edge of the light shielding film 116 is an edge on the upstream side in the scan direction. On the other hand, a distance Ds2 is defined as the distance between the other edge of the PD opening 116A and another N-type area 107a on the scan-direction downstream side of the other edge. The other edge of the PD opening 116A is an edge on the downstream side in the scan direction.

The unit pixel is configured to have the distance Ds2 on the downstream side in the scan direction longer than the distance Dn2 on the upstream side in the scan direction. The distance Dn2 is the distance between the PD opening 116A and the memory section MEM which are included in the same unit pixel. Thus, the distance Dn2 means the width of a light shielding film between the PD opening 116A and the memory section MEM in the unit pixel. On the other hand, the distance Ds2 is the distance between the PD opening 116A in a specific unit pixel and the memory section MEM in another unit pixel adjacent to the specific unit pixel. Thus, the distance Ds2 means the width of a light shielding film between the PD opening 116A in a specific unit pixel and the memory section MEM in another unit pixel adjacent to the specific unit pixel. The reader is advised to keep in mind that it is more desirable to set the distance Ds2 at a value at least 1.5 times the distance Dn2.

As described above, even if the pixel structure satisfying the relation Ds1>Dn1 as shown in FIG. 17 cannot be implemented, by applying the distance prescription according to the second embodiment shown in FIG. 20, the same effect can be obtained. The reader is advised to keep in mind that it is the magnitude of the inclined light component and other factors that determine which of the relation Ds1>Dn1 and the relation Ds2>Dn2 is capable of reducing the noise quantity. Thus, it is difficult to make a sweeping judgment about whether the relation Ds1>Dn1 or the relation Ds2>Dn2 is capable of reducing the noise quantity. However, it is nice to satisfy at least one of the two relations and, as a matter of fact, it is more desirable to satisfy both the relations.

3: Third Embodiment

Figure 21:
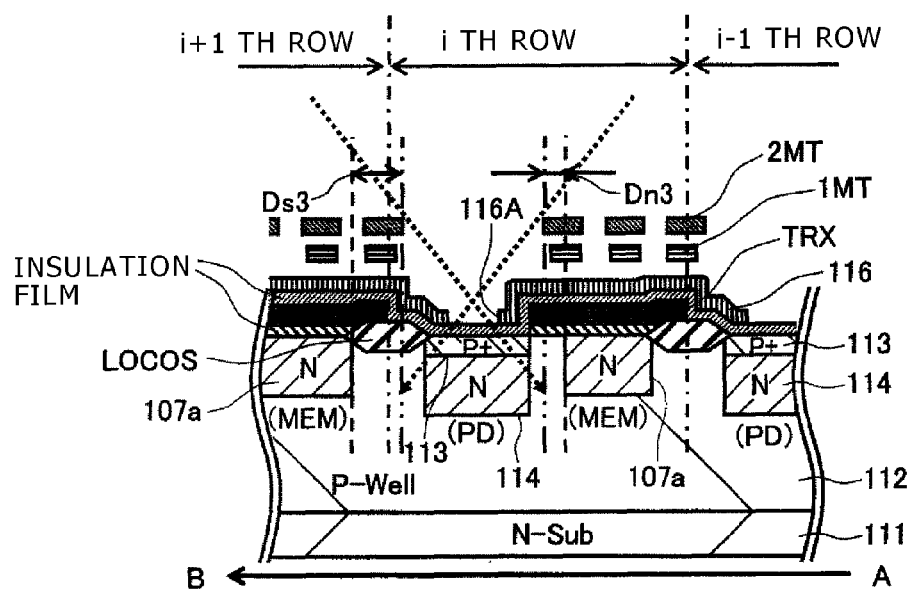
FIG. 21 is a pixel-structure cross-sectional diagram to be referred to in description of a method for prescribing distances in accordance with a third embodiment.

FIG. 21 is a pixel structure cross-sectional diagram referred to in the following description of a method for prescribing distances in accordance with a third embodiment. FIG. 21 is a diagram corresponding to FIG. 17 provided for the first embodiment. That is to say, FIG. 21 is a cross-sectional diagram showing a structure along a line A-B shown in FIG. 16. It is to be noted that FIGS. 10 to 16 provided for the first embodiment can also be applied to the third embodiment.

Much like FIG. 17, FIG. 21 shows a unit pixel on the ith pixel row at the center of the figure, a portion of a unit pixel on the (i−1)th pixel row on the right side of the figure and a portion of a unit pixel on the (i+1)th pixel row on the left side of the figure. The unit pixels are separated and insulated electrically from each other by an element separation layer prescribing an active layer mentioned before. In the structure shown in the figure, the element separation layer is a LOCOS layer. However, it is possible to employ an element separation layer of another type. Typical examples of the element separation layer of another type are the STI, EDI and FLAT element separation layers.

A distance Dn3 is defined as the distance between the N-type area 107a of the memory section MEM to be protected against incoming leak light becoming noises and an edge of a wire layer serving as a member of the incident light path limiting section. In this case, the wire layer is an upper-level wire layer which is a second wire layer (2MT). Also referred to as a light shielding edge, the edge of the wire layer is an edge on the upstream side in the scan direction. On the other hand, a distance Ds3 is defined as the distance between an edge of another wire layer and another N-type area 107a on the scan-direction downstream side of the edge of the other wire layer. The other wire layer is a layer on the downstream side in the scan direction if seen from the opening of the incident light path limiting section. In this case, the other wire layer is an upper-level wire layer which is a second wire layer (2MT). Also referred to as a light shielding edge, the edge of the other wire layer is an edge on the upstream side in the scan direction.

A first wire layer (1MT) and a second wire layer (2MT) are shown in FIG. 21. In particular, however, the second wire layer (2MT) is a wire extended in the horizontal direction as a pixel signal line. Thus, the second wire layer (2MT) is a dominant member for limiting the pixel opening in the A-B direction. It is to be noted that, in general, among wire layers with the same scan-direction edge position, the upper-level wire layer easily becomes a member for limiting inclined light. If the lower-level wire layer is pulled out into the opening more than the upper-level wire layer, however, the lower-level wire layer may become the member for limiting inclined light in some cases. Thus, FIG. 21 is not to be interpreted as a figure excluding distance prescription making use of the lower-level wire layer such as the first wire layer (1MT).

The unit pixel is configured to have the distance Ds3 on the downstream side in the scan direction longer than the distance Dn3 on the upstream side in the scan direction. The distance Dn3 is the distance between the wire-layer light shielding edge and the memory section MEM which are included in the same unit pixel. Thus, the distance Dn3 means the width of light shielding provided by a wire between the wire-layer light shielding edge and the memory section MEM in the unit pixel. On the other hand, the distance Ds3 is the distance between the wire-layer light shielding edge in a specific unit pixel and the memory section MEM in another unit pixel adjacent to the specific unit pixel. Thus, the distance Ds3 means the width of light shielding provided by a wire between the wire-layer light shielding edge in a specific unit pixel and the memory section MEM in another unit pixel adjacent to the specific unit pixel. The reader is advised to keep in mind that it is more desirable to set the distance Ds3 at a value at least 1.5 times the distance Dn3.

The 2MT has been taken as an example. For the reason described above, however, the 1MT or a wire layer at an even higher level can also be used provided that the 1MT or the wire layer at an even higher level is predominant for the opening on the incident light path limiting section.

As described above, even if the pixel structure satisfying the relation Ds1>Dn1 as shown in FIG. 17 or the relation Ds2>Dn2 as shown in FIG. 20 cannot be implemented, by applying the distance prescription according to the third embodiment shown in FIG. 21, the same effect can be obtained. The reader is advised to keep in mind that it is the magnitude of the inclined light component, the structure of the incident light path limiting section and other factors that determine which of the relation Ds1>Dn1, the relation Ds2>Dn2 and the relation Ds3>Dn3 is capable of reducing the noise quantity. Thus, it is difficult to make a sweeping judgment about whether the relation Ds1>Dn1, the relation Ds2>Dn2 or the relation Ds3>Dn3 is capable of reducing the noise quantity. However, it is nice to satisfy at least one of the three relations and it is desirable to satisfy two of the three relations. As a matter of fact, it is even more desirable to satisfy all the three relations.

Next, the following description explains embodiments in which the read section is placed on the scan-direction upstream side of the opto-electric conversion section PD. That is to say, the read section is placed on the side closer to the scan-start pixel row.

4: Fourth Embodiment

Next, a fourth embodiment is explained by referring to FIGS. 22 to 26 as follows.

Figure 22:
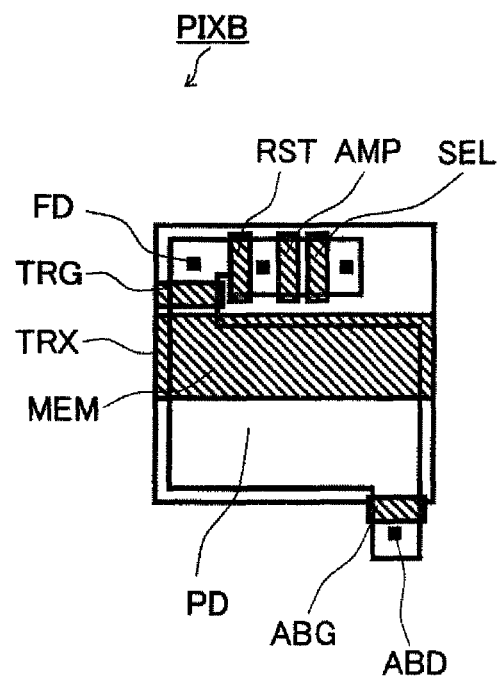
FIG. 22 is a top-view diagram showing the configuration of a unit pixel according to a fourth embodiment.
Figure 23:
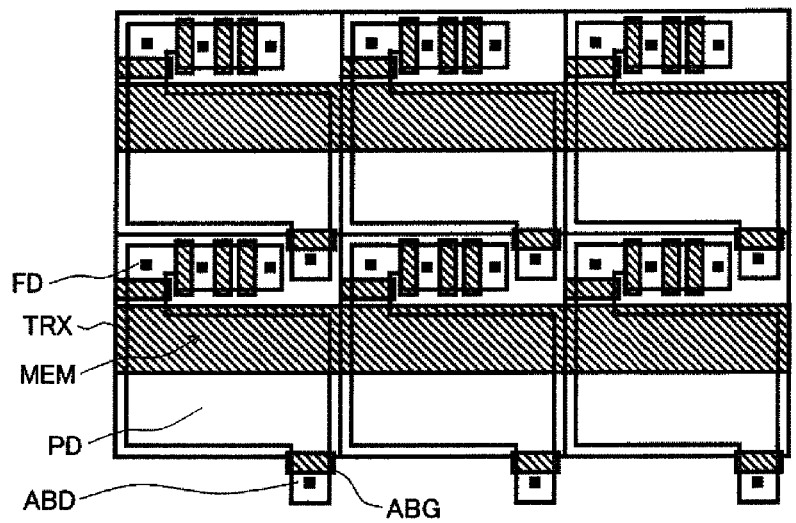
FIG. 23 is a top-view diagram showing the basic configuration of a pixel array according to the fourth embodiment.
Figure 24:
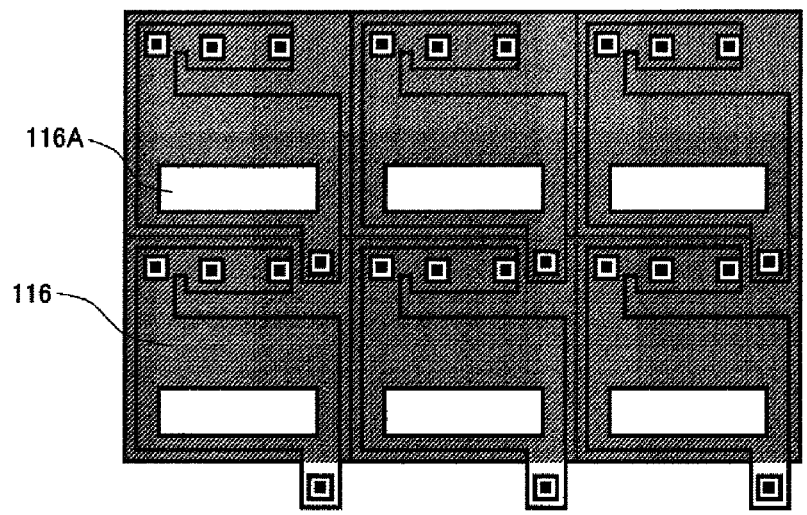
FIG. 24 is a top-view diagram showing a layout of field shielding films for shielding the basic configuration of the pixel array shown in FIG. 23 against light and a layout of PD openings.
Figure 25:
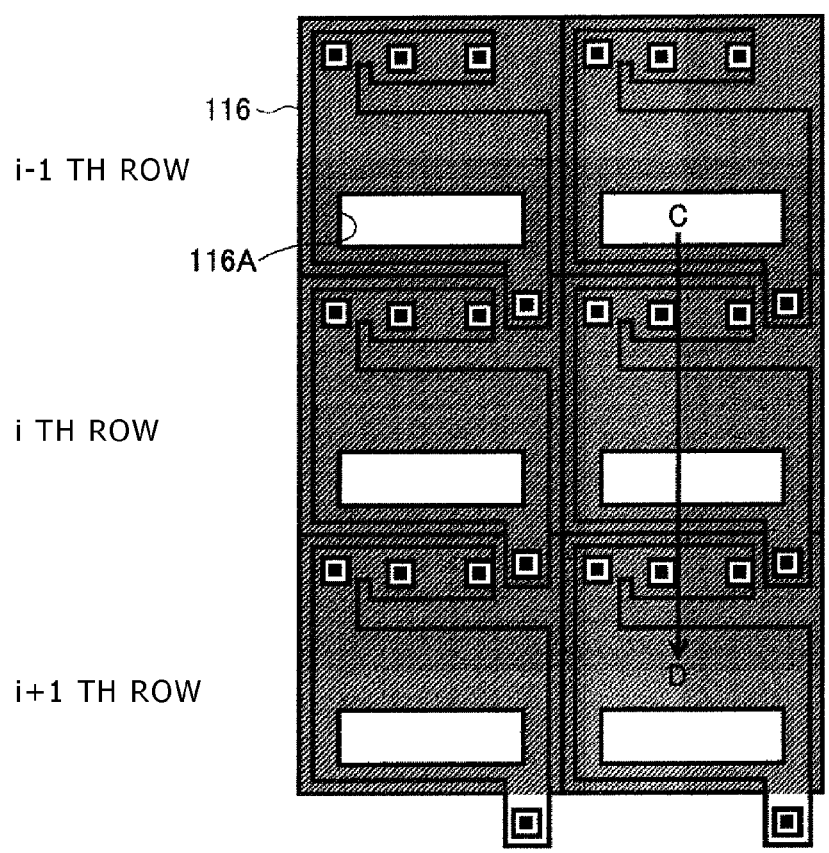
FIG. 25 is a top-view diagram showing the basic configuration of the pixel array for three scanned pixel rows.
Figure 26:
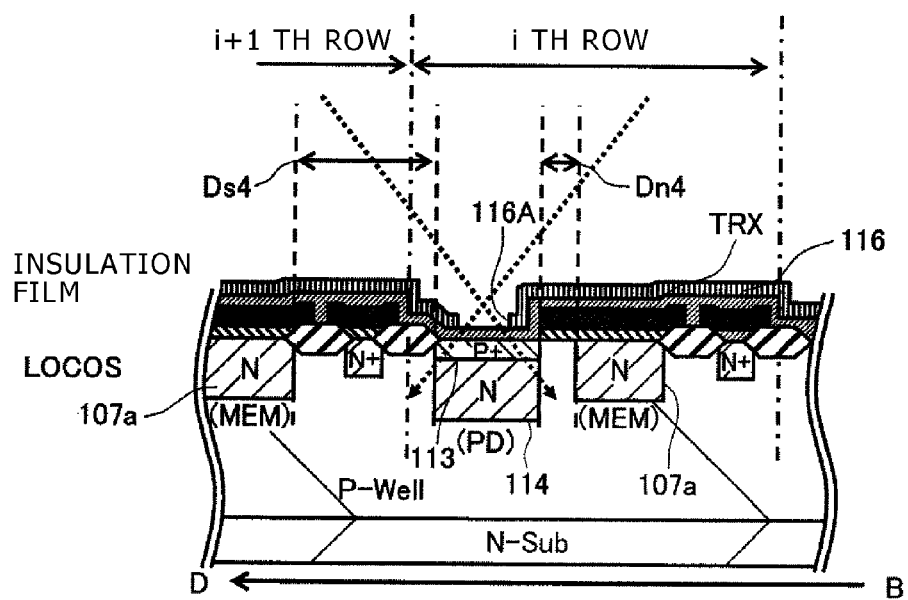
FIG. 26 is a pixel-structure cross-sectional diagram to be referred to in description of a method for prescribing distances in accordance with the fourth embodiment.

FIG. 22 is a top-view diagram showing the configuration of a unit pixel PIXB according to the fourth embodiment. FIG. 23 is a top-view diagram showing the basic configuration of a pixel array composed of unit pixels PIXB arranged to form a pixel matrix. The unit pixel PIXB has the pattern shown in FIG. 22. The basic configuration is a configuration for 6 unit pixels PIXB. The pixel array is the pixel array 11 employed in the CMOS image sensor 10 shown in FIG. 10. FIG. 24 is a top-view diagram showing a layout of light shielding films 116 for shielding the basic configuration of the pixel array shown in FIG. 23 against light and a layout of PD openings 116A each provided for one of the light shielding films 116. FIG. 25 is an explanatory top-view diagram showing the basic configuration of the pixel array for three scanned pixel rows each composed of unit pixels PIXB. FIG. 26 is a pixel structure cross-sectional diagram to be referred to in the following description of a method for prescribing distances in accordance with the fourth embodiment. The cross section shown in FIG. 26 is a cross section along a line C-D shown in the diagram of FIG. 25.

The equivalent circuit composed of elements employed in the unit pixel PIXB is basically identical with that of the unit pixel according to the first embodiment. In the case of the fourth embodiment, however, the opto-electric conversion section PD, the memory section MEM and the transistor area serving as the read section are laid out in the scan direction.

In the case of the fourth embodiment, the area allocated to the memory section MEM is spread almost all over the area of the pixel size in the pixel width direction also referred to as the row direction. Thus, on the joint between two unit pixels adjacent to each other in the row direction also referred to as the horizontal direction, a first transfer gate TRX can be created. As a result, it is possible to prevent a contact portion from dropping from a pixel signal line used for driving the first transfer gate TRX provided for every unit pixel. In addition, since the distance between the opto-electric conversion section PD and the memory section MEM adjacent to the opto-electric conversion section PD can be made shorter, the number of unnecessary contact openings for the light shielding film 116 can be reduced. As a result, the light shielding function of the light shielding film 116 can be improved in order to decrease the noise quantity. In addition, since the size of the dead space decreases, the size of an area allocated to the opto-electric conversion section PD and the memory section MEM can be increased.

On top of that, a pixel-transistor area allocated to the read section is provided between the memory sections MEM of two pixel areas. Thus, among other things, the distance Ds3 between the opto-electric conversion section PD and the memory section MEM on the downstream side in the scan direction can be set at a large value so that it is possible to provide a layout in which the relation Ds1>Dn1 set for the first embodiment described earlier is easy to satisfy. For the same reason, it is possible to provide a state in which the relation Ds2>Dn2 set for the second embodiment and, in addition, the relation Ds3>Dn3 set for the third embodiment are easy to satisfy.

FIG. 25 is an explanatory top-view diagram showing the basic configuration of the pixel array for three scanned pixel rows each composed of unit pixels PIXB each including a light shielding film 116. The three scanned pixel rows are respectively an (i−1)th pixel row, an ith pixel row and (i−1)th pixel row which are arranged in the scan direction. In the scan direction, the relation between the position of the memory section MEM (serving as the electric-charge holding section) or the floating diffusion capacitor FD and the position of the opto-electric conversion section PD provided in the same unit pixel as the memory section MEM or the floating diffusion capacitor FD is set as follows. The memory section MEM or the floating diffusion capacitor FD is located on the upstream side of the opto-electric conversion section PD.

FIG. 26 is a pixel structure cross-sectional diagram to be referred to in the following description of a method for prescribing distances in accordance with the fourth embodiment. The cross section shown in FIG. 26 is a cross section along a line C-D shown in the diagram of FIG. 25. It is to be noted that the pixel array according to the fourth embodiment is the pixel array 11 employed in the CMOS image sensor 10 shown in FIG. 10 as a sensor according to the first embodiment.

Much like FIG. 17, FIG. 26 shows a unit pixel on the ith pixel row at the center of the figure, a portion of a unit pixel on the (i−1)th pixel row on the right side of the figure and a portion of a unit pixel on the (i+1)th pixel row on the left side of the figure. The unit pixels are separated and insulated electrically from each other by an element separation layer prescribing an active layer mentioned before. In the structure shown in the figure, the element separation layer is a LOCOS layer. However, it is possible to employ an element separation layer of another type. Typical examples of the element separation layer of another type are the STI, EDI and FLAT element separation layers.

A distance Dn4 is the distance between the opto-electric conversion section PD of a unit pixel on the ith pixel row and the memory section MEM on the scan-direction upstream side of the opto-electric conversion section PD. Conversely, a distance Ds4 is the distance between the opto-electric conversion section PD of the unit pixel and the memory section MEM on the scan-direction downstream side of the opto-electric conversion section PD. The distance Ds4 is sufficiently longer than the distance Dn4.

The distance Dn4 is the distance between the opto-electric conversion section PD and the memory section MEM which are employed in the same unit pixel. Thus, the distance Dn4 means the length of a transfer of electric charge from the opto-electric conversion section PD to the memory section MEM. On the other hand, the distance Ds4 is the distance between the opto-electric conversion section PD of a specific unit pixel and the memory section MEM of a pixel unit adjacent to the specific unit pixel. Thus, the distance Ds4 means the width of separation between unit pixels adjacent to each other. The reader is advised to keep in mind that it is desirable to set the distance Ds4 at a value at least two times the distance Dn4.

In the case of the fourth embodiment, a pixel transistor area to be used as the read section is sandwiched within a region covered by the distance Ds4 on the downstream side in the scan direction. Thus, in comparison with the first embodiment, the noise elimination effect provided by the fourth embodiment is big.

It is to be noted that FIG. 26 shows only a portion corresponding to the relation Ds1>Dn1 set for the first embodiment. It is a matter of course, however, that the unit pixel according to the fourth embodiment has a configuration easily allowing both the relation Ds2>Dn2 set for the second embodiment and the relation Ds3>Dn3 set for the third embodiment also to hold true as well.

By providing a pixel transistor area between two unit pixels adjacent to each other in the scan direction as described above, it is possible to assure a larger difference between the distances Dnx and Dsx where x is an integer in the range 1 to 4. As a result, the noise quantity and the noise unevenness can be sufficiently reduced.

5: Fifth Embodiment

Next, a fifth embodiment is explained by referring to FIGS. 27 to 31 as follows.

Figure 27:
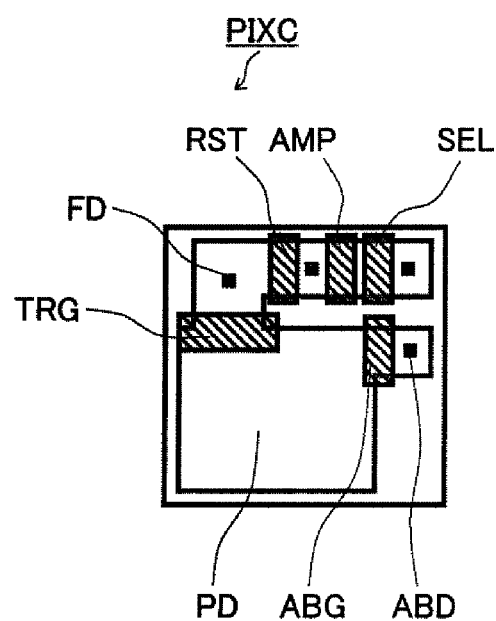
FIG. 27 is a top-view diagram showing the configuration of a pixel according to a fifth embodiment.
Figure 28:
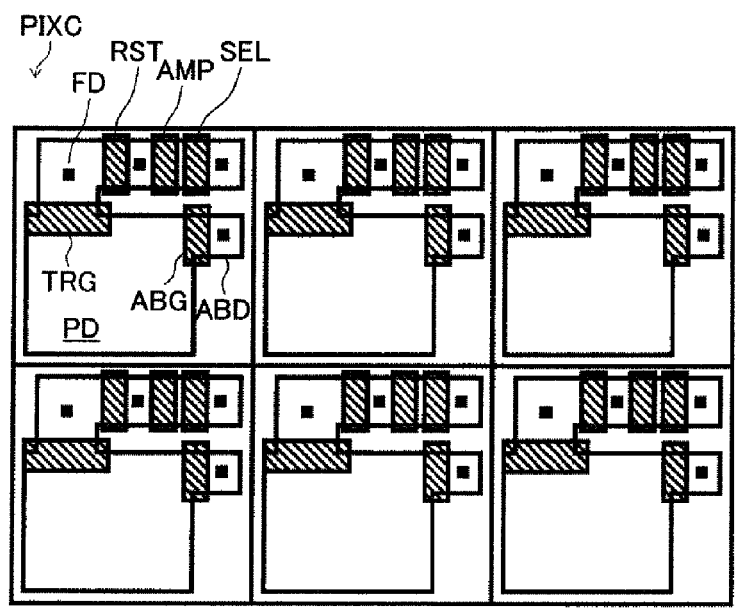
FIG. 28 is a top-view diagram showing the basic configuration of a pixel array according to the fifth embodiment.
Figure 29:
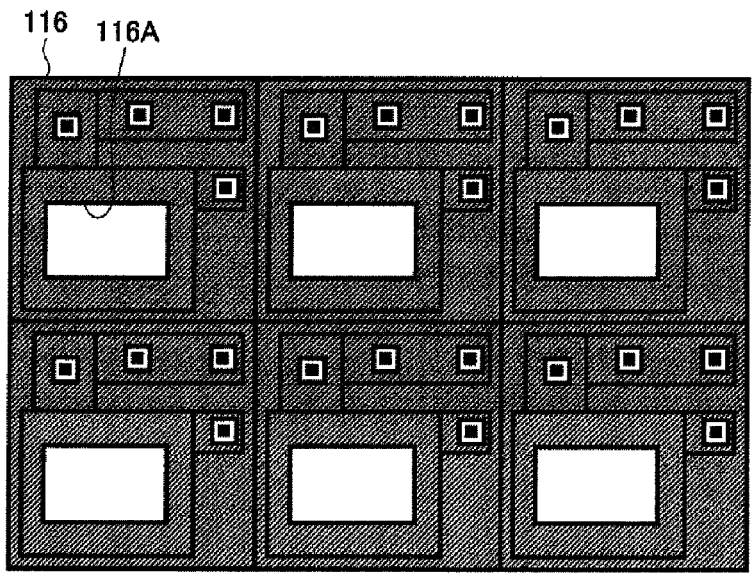
FIG. 29 is a top-view diagram showing a layout of field shielding films for shielding the basic configuration of the pixel array shown in FIG. 28 against light and a layout of PD openings.
Figure 30:
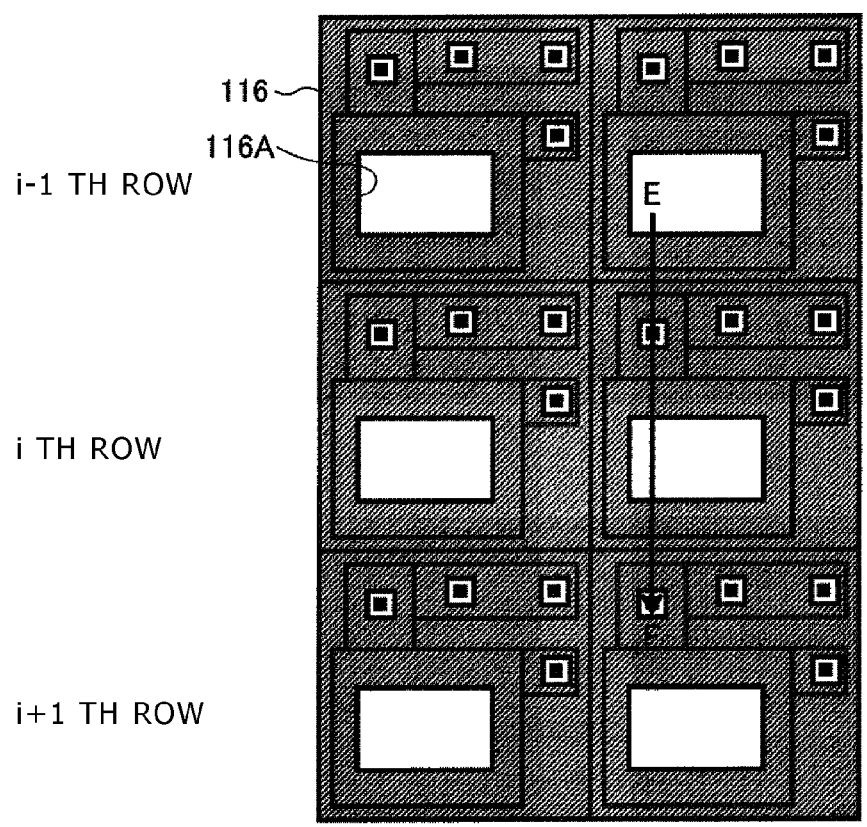
FIG. 30 is a top-view diagram showing the basic configuration of the pixel array for three scanned pixel rows.
Figure 31:
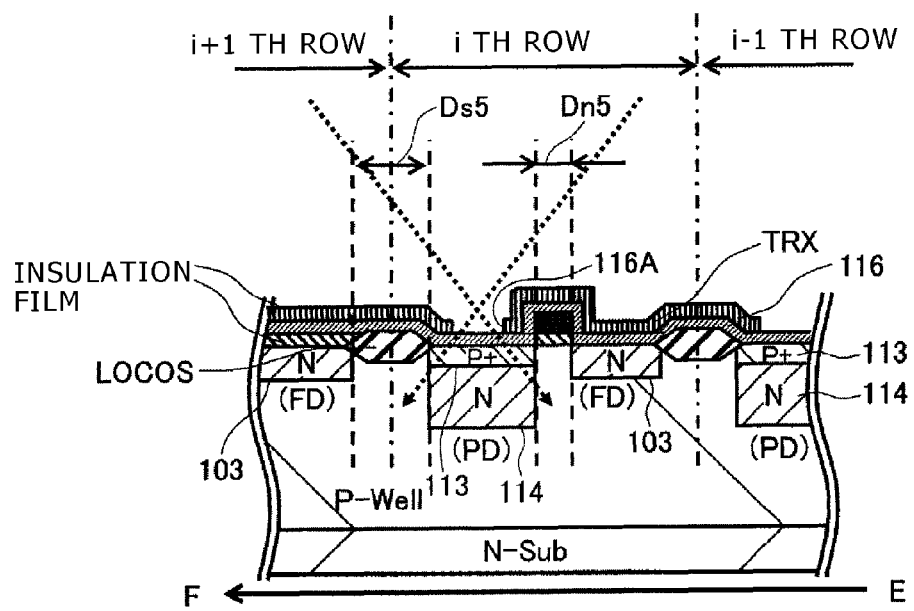
FIG. 31 is a pixel-structure cross-sectional diagram to be referred to in description of a method for prescribing distances in accordance with the fifth embodiment.

FIG. 27 is a top-view diagram showing the configuration of a unit pixel PIXC according to the fifth embodiment. FIG. 28 is a top-view diagram showing the basic configuration of a pixel array composed of unit pixels PIXC arranged to form a pixel matrix. The unit pixel PIXC has the pattern shown in FIG. 27. The basic configuration is a configuration for 6 unit pixels PIXC. The pixel array is the pixel array 11 employed in the CMOS image sensor 10 shown in FIG. 10. FIG. 29 is a top-view diagram showing a layout of light shielding films 116 for shielding the basic configuration of the pixel array shown in FIG. 28 against light and a layout of PD openings 116A each provided for one of the light shielding films 116. FIG. 30 is an explanatory top-view diagram showing the basic configuration of the pixel array for three scanned pixel rows each composed of unit pixels PIXC. FIG. 31 is a pixel structure cross-sectional diagram to be referred to in the following description of a method for prescribing distances in accordance with the fifth embodiment. The cross section shown in FIG. 31 is a cross section along a line E-F shown in the diagram of FIG. 30.

Each of the basic configurations shown in FIGS. 27 and 28 include the same pixel elements as the first embodiment except that the memory section MEM is excluded from each of the configurations. That is to say, the fifth embodiment carries out a global shutter driving operation by holding electric charge in the floating diffusion capacitor FD as is the case with the structure according to the existing technologies.

In the case of the fifth embodiment, the floating diffusion capacitor FD and the pixel transistor area used as the read section are laid out in the row direction. The array of these two elements in the row direction and the opto-electric conversion section PD are laid out in the column direction which is the scan direction. For example, the opto-electric conversion section PD is placed on the scan-direction downstream side of the array of the floating diffusion capacitor FD and the pixel transistor area.

The number of contact portions in the patterns shown in FIG. 29 as the patterns of the light shielding films 116 is reduced by a quantity corresponding to the area of the eliminated memory section MEM. Thus, the light shielding function carried out by the fifth embodiment is relatively good.

FIG. 30 is an explanatory top-view diagram showing the basic configuration of the pixel array for three scanned pixel rows each composed of unit pixels PIXC each including a light shielding film 116. The three scanned pixel rows are respectively an (i−1)th pixel row, an ith pixel row and (i−1)th pixel row which are arranged in the scan direction. In the scan direction, the relation between the position of the floating diffusion capacitor FD serving as the electric-charge holding section and the position of the opto-electric conversion section PD provided in the same unit pixel as the floating diffusion capacitor FD is set as follows. The floating diffusion capacitor FD is located on the scan-direction upstream side of the opto-electric conversion section PD.

FIG. 31 is a pixel structure cross-sectional diagram to be referred to in the following description of a method for prescribing distances in accordance with the fifth embodiment. The cross section shown in FIG. 31 is a cross section along a line E-F shown in the diagram of FIG. 30. It is to be noted that the pixel array according to the fifth embodiment is the pixel array 11 employed in the CMOS image sensor 10 shown in FIG. 10 as a sensor according to the first embodiment.

Much like FIG. 17, FIG. 31 shows a unit pixel on the ith pixel row at the center of the figure, a portion of a unit pixel on the (i−1)th pixel row on the right side of the figure and a portion of a unit pixel on the (i+1)th pixel row on the left side of the figure. The unit pixels are separated and insulated electrically from each other by an element separation layer prescribing an active layer mentioned before. In the structure shown in the figure, the element separation layer is a LOCOS layer. However, it is possible to employ an element separation layer of another type. Typical examples of the element separation layer of another type are the STI, EDI and FLAT element separation layers.

A distance Dn5 is the distance between the opto-electric conversion section PD of a unit pixel on the ith pixel row and the floating diffusion capacitor FD on the scan-direction upstream side of the opto-electric conversion section PD. Conversely, a distance Ds5 is the distance between the opto-electric conversion section PD of the unit pixel and the floating diffusion capacitor FD on the scan-direction downstream side of the opto-electric conversion section PD. The distance Ds5 is sufficiently longer than the distance Dn5.

The distance Dn5 is the distance between the opto-electric conversion section PD and the floating diffusion capacitor FD which are employed in the same unit pixel. Thus, the distance Dn5 means the length of a transfer of electric charge from the opto-electric conversion section PD to the floating diffusion capacitor FD. On the other hand, the distance Ds5 is the distance between the opto-electric conversion section PD of a specific unit pixel and the floating diffusion capacitor FD of a pixel unit adjacent to the specific unit pixel. Thus, the distance Ds5 means the width of separation between unit pixels adjacent to each other.

It is to be noted that FIG. 31 shows only a portion corresponding to the relation Ds1>Dn1 set for the first embodiment. It is a matter of course, however, that the unit pixel according to the fifth embodiment has a configuration easily allowing both the relation Ds2>Dn2 set for the second embodiment and the relation Ds3>Dn3 set for the third embodiment also to hold true as well.

As is obvious from the above description, the present invention can also be applied to a structure including the floating diffusion capacitor FD but excluding the memory section MEM in accordance with an existing technology to serve as a structure for carrying out a global shutter driving operation.

In addition, by providing a pixel transistor area between two unit pixels adjacent to each other in the scan direction in the same way as the fourth embodiment described above, it is possible to assure a larger difference between the distances Dnx and Dsx where x is an integer in the range 1 to 4.

The fifth embodiment has been exemplified by taking the structure of a global shutter unit pixel, which is based on an operation to hold electric charge in the floating diffusion capacitor FD, as an example. However, the above exemplification also holds true for any other pixel structure as well as long as the other pixel structure requires that the amount of noise unevenness generated in the global shutter driving operation be reduced. Typical examples of the other pixel structure include a structure having a ring gate and a structure increasing the capacitance of the floating diffusion capacitor FD by making use of an additional capacitor.

6: Sixth Embodiment

A sixth embodiment implements a technology for reducing the number of wires in combination with any of the first to fifth embodiments.

Figure 32:
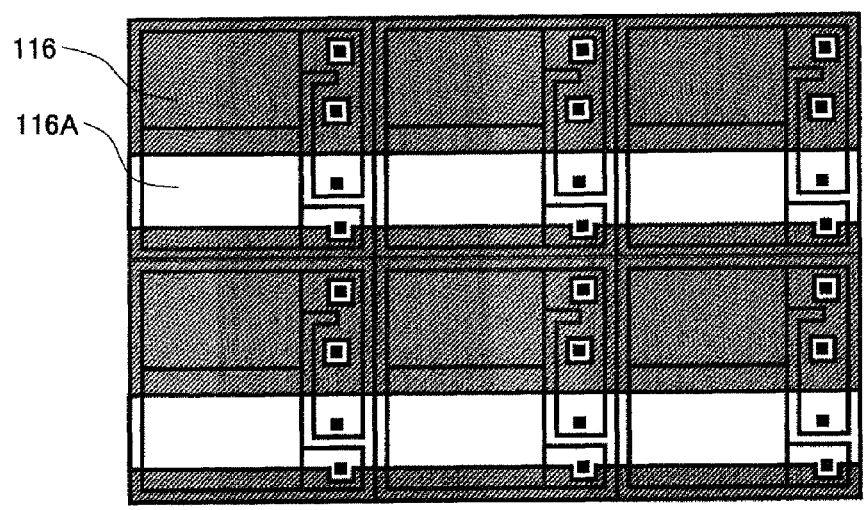
FIG. 32 is a top-view diagram showing a layout of field shielding films for shielding the basic configuration of a pixel array according to a sixth embodiment against light and a layout of PD openings.

FIG. 32 is a top-view diagram showing a layout of films 116 for shielding the basic configuration of a pixel array according to a sixth embodiment against light and a layout of PD openings 116A.

In the pixel array shown in FIG. 32, the PD opening 116A for photodiodes PD of unit pixels adjacent to each other in the horizontal direction is not divided by a light shielding film 116, forming an opening having a line shape which is continuous in the horizontal direction. In other words, the light shielding film 116 is divided in the vertical direction which is the scan direction, forming the shape of long parallel stripes oriented in the horizontal direction.

As has been explained earlier by referring to FIGS. 6 and 7, the horizontal-direction size of the pixel array 11 is greater than the vertical-direction size of the pixel array 11. Thus, the incidence angle for a unit pixel on a horizontal edge of the pixel array 11 is severer than the incidence angle for a unit pixel on a vertical edge of the pixel array 11.

In the horizontal direction of the pixel array according to this embodiment, basically, the magnitude of the incidence angle for this direction does not affect noises. This is because a light shielding section is not provided between photodiodes PD separated from each other in the horizontal direction to serve as opto-electric conversion elements. Thus, it is necessary to only solve a mixed-color problem encountered in an ordinary image sensor. A mixed color is a sort of optical crosstalk. Accordingly, as a countermeasure against noises, a light shielding film 116 is not provided between opto-electric conversion sections separated from each other in the horizontal direction. As a result, the number of light shielding films 116 can be reduced so that the optical sensitivity can be improved.

It is to be noted that the area from which the light shielding film is eliminated is an area allocated to creation of pixel transistors. Thus, this area does not have the function to accumulate electric charge. As a result, even the light shielding section for shielding this area against light is eliminated, the elimination does not have an effect on noises.

In addition, by configuring the pixel array into a structure shown in FIG. 32, the light shielding film 116 can be created isolatively for every pixel row. Thus, the light shielding film 116 can also be used as a pixel signal line. As a result, for every light shielding film 116, one pixel signal line can be eliminated. Accordingly, the degree of freedom to design the layout can be raised and the pixel-opening area prescribed by wires can also be increased as well. In addition, the number of contact openings for the light shielding film 116 can be reduced so that the noise quantity can also be decreased as well.

The reader is advised to keep in mind that it is also possible to provide a configuration in which the light shielding film 116 occupies an area which is contiguous in the direction of the pixel row and covers some pixel rows adjacent to each other in the scan direction. Typically, the light shielding film 116 covers at least two pixel rows adjacent to each other in the scan direction. Even in the case of such a configuration, there are provided effects that the light sensitivity can be improved and the degree of freedom to design the layout can also be raised as well. In addition, since the number of contact openings for the light shielding film 116 can be reduced, the noise quantity can be decreased too. These effects are great in comparison with a configuration in which a light shielding film 116 is provided for every unit pixel.

7: Seventh Embodiment

A seventh embodiment implements a technology for sharing the pixel driving line 16 in combination with any of the first to sixth embodiments.

Figure 33:
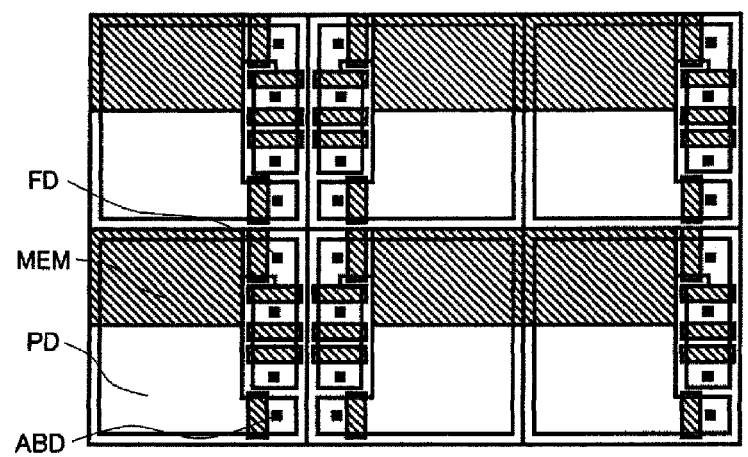
FIG. 33 is a top-view diagram showing the basic configuration of a pixel array according to a seventh embodiment.

FIG. 33 is a top-view diagram showing the basic configuration of a pixel array according to the seventh embodiment. The figure shows a pixel array for six unit pixels.

On a joint between at least two unit pixels adjacent to each other in the horizontal direction, gate electrodes are created to serve as common electrodes to be shared by the unit pixels. As explained earlier by referring to FIG. 10, a pixel row oriented in the horizontal direction is driven by a pixel driving line 16 common to all unit pixels on the pixel row. Thus, the gate electrodes can be shared by the two unit pixels adjacent to each other in the horizontal direction.

In accordance with the existing technologies, each gate electrode provided for a unit pixel is separated by a certain space from the corresponding gate electrode provided for another unit pixel. In the pixel-array structure according to the seventh embodiment, however, every gate electrode can be shared by unit pixels adjacent to each other in the horizontal direction along a pixel row driven by a pixel driving line 16 common to all unit pixels on the pixel row. It is thus possible to eliminate the inter-gate space required in the existing technologies. In addition, it is also possible to reduce the number of contact portions individually required in the existing technologies. As a result, there is room to increase the size of an area to be occupied by elements such as the electric-charge holding section and the opto-electric conversion section PD serving as the opto-electric conversion section. In addition, by reducing the number of contact openings for the light shielding film 116, the noise quantity can also be decreased as well.

It is to be noted that in the case of the first to third embodiments, the space is eliminated by reversing the horizontal orientation of the unit pixel for each of unit pixels laid out in the horizontal direction to result in the pixel array shown in FIG. 33. In the case of other embodiments such as the fourth embodiment shown in FIG. 22, however, the space is eliminated by sharing one first transfer gate TRX among a plurality of unit pixels laid out in the horizontal direction without reversing the horizontal orientation of all unit pixels.

In addition, by sharing an element other than the first transfer gate TRX, it is also possible to result in the same effect as that produced by sharing the first transfer gate TRX. Typical examples of the other element are the second transfer gate TRG, the electric-charge exhausting gate ABG, the SEL driving signal lines 16S for conveying the select pulse SEL and the reset line RST for conveying the reset pulse RST.

The first transfer gate TRX occupies the largest area and has the longest circumference among the gate electrodes included in the unit pixel. Thus, a dead space that can be eliminated by sharing the first transfer gate TRX among unit pixels adjacent to each other is largest among the gate electrodes included in the unit pixel. In addition, with regard to contact openings of the light shielding film 116, the closer the contact opening to the memory section MEM, the bigger the effect of the contact opening on the noise. Thus, also from the noise-reduction point of view, it is desirable to share the first transfer gate TRX in order to get rid of a contact opening closest to the memory section MEM.

8: Eighth Embodiment

An eighth embodiment implements an array-configuration technology in combination with any of the first to seventh embodiments.

Figure 34:
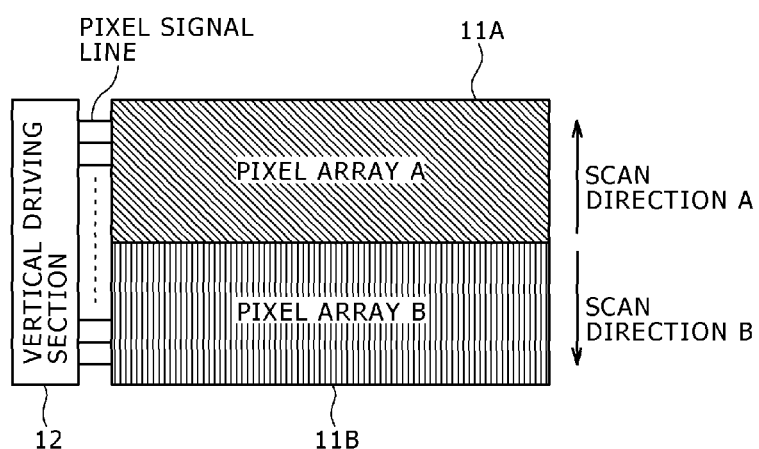
FIG. 34 is a diagram showing the basic configuration of two pixel arrays according to an eighth embodiment.
Figure 35:
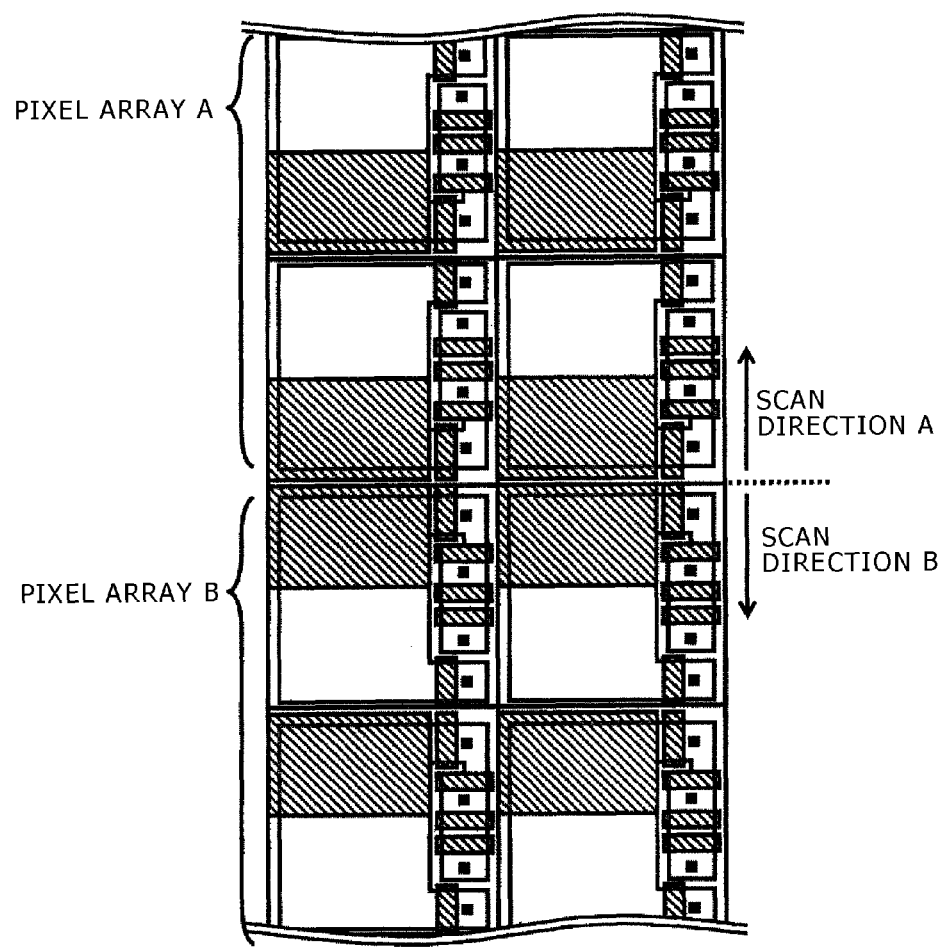
FIG. 35 is an enlarged diagram obtained by enlarging a portion of the basic configuration shown in FIG. 34.
Figure 36A:
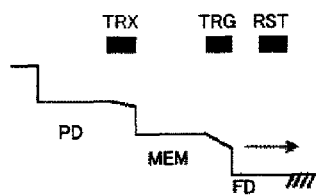
FIGS. 36A to 36G are a plurality of model diagrams to be referred to in description of electric-charge exhausting, global-exposure, electric-charge accumulation, read and electric-charge transfer operations carried out by a unit pixel employing a memory section.
Figure 36B:
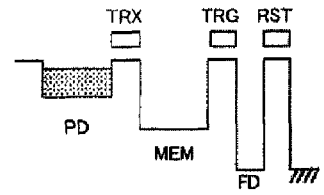
Figure 36C:
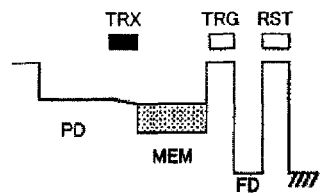
Figure 36D:
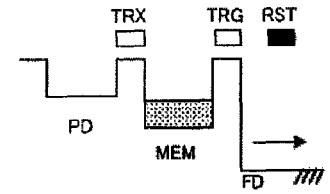
Figure 36E:
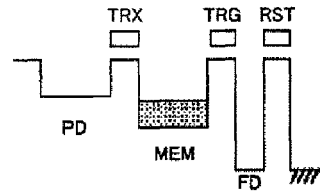
Figure 36F:
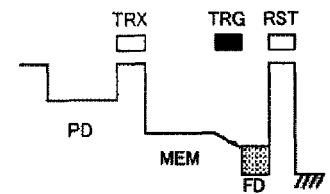
Figure 36G:
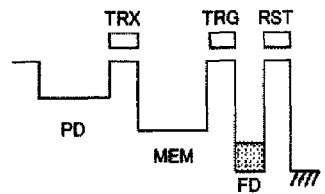

FIG. 34 is a diagram showing the basic configuration of two pixel arrays according to the eighth embodiment whereas FIG. 35 is an enlarged diagram obtained by enlarging a portion of the configuration shown in FIG. 34 as a diagram showing details of the configuration.

As shown in FIG. 34, the pixel array 11 employed in the CMOS image sensor 10 shown in FIG. 10 is divided by the center line perpendicular to the scan direction into an upper-half pixel array 11A and a lower-half pixel array 11B.

The vertical driving section 12A is capable of carrying out a scan operation on the upper-half pixel array 11A and the lower-half pixel array 11B in the vertical direction at the same time. To put it in detail, the vertical driving section 12A carries out a scan operation on the upper-half pixel array 11A from the center line in the upward direction and the lower-half pixel array 11B from the center line in the downward direction. The direction of the scan operation carried out on the upper-half pixel array 11A is referred to as a scan direction A whereas the direction of the scan operation carried out on the lower-half pixel array 11B is referred to as a scan direction B.

Also referred to as a scan driving section, the vertical driving section 12A capable of carrying out a scan operation on the upper-half pixel array 11A and the lower-half pixel array 11B in the vertical direction independently at the same time can be said to be a vertical driving section actually including a first scan driving section for driving the upper-half pixel array 11A and a second scan driving section for driving the lower-half pixel array 11B.

It is to be noted that the vertical driving section 12A is also capable of carrying out control to start exposure operations of the upper-half pixel array 11A and the lower-half pixel array 11B with timings different from each other. The predetermined pixel area used in the descriptions explaining the embodiments so far means the entire pixel area which is the effective pixel area of the pixel array 11. For a structure in which the entire pixel area is divided into a plurality of partial pixel areas and driving operations can be carried out on the partial pixel areas as is the case with the eighth embodiment, on the other hand, the predetermined pixel area does not necessarily imply the entire pixel area but may mean a partial pixel area smaller than the entire pixel area.

FIG. 35 is an enlarged diagram obtained by enlarging a boundary portion of the configuration shown in FIG. 34.

That is to say, FIG. 35 shows a portion on a boundary between the upper-half pixel array 11A and the lower-half pixel array 11B. The upper-half pixel array 11A on the upstream side in the scan direction and lower-half pixel array 11B on the downstream side in the scan direction are symmetrical with respect to the boundary line between the upper-half pixel array 11A and the lower-half pixel array 11B. The upper-half pixel array 11A and the lower-half pixel array 11B are configured in this way in order to sustain the relationship between the opto-electric conversion section PD serving as the opto-electric conversion section and the electric-charge holding section in the relation between the scan-direction upstream side also referred to as the scan-start pixel-row side and the scan-direction downstream side also referred to as the scan-end pixel-row side in the same way as the embodiments described previously.

By having such a configuration, it is possible to avoid the use of a portion having a strict incidence angle and a large noise quantity. Thus, the noise quantity can be further reduced. In addition, the noise unevenness can be made symmetrical with respect to the center line perpendicular to the scan direction in the upward and downward directions from the center line.

It is to be noted that the driving operation carried out by the vertical driving section 12A also referred to as the scan driving section does not have to be driving operations carried out at the same time on the upper-half pixel array 11A and the lower-half pixel array 11B in the scan directions A and B respectively as shown in FIG. 35. That is to say, the driving operation can also be carried out by the vertical driving section 12A on the upper-half pixel array 11A and the lower-half pixel array 11B alternately to give the same effects. In this case, the frame rate is equal to that of a one-side scan operation. However, it is possible to avoid the need to increase the sizes of the column processing section and sections provided at stages subsequent to the column processing section.

In addition, as described above, the pixel array 11 can also be divided into two halves, i.e., the upper-half pixel array 11A and the lower-half pixel array 11B which are described as follows. First pixel rows composing the upper-half pixel array 11A and second pixel rows composing the lower-half pixel array 11B are pixel rows arranged alternately.

In this case, a portion with a strict incidence angle and a large noise quantity is used. However, the noise unevenness can be made symmetrical with respect to the center line of the scan direction in the upward and downward directions from the center line.

9: Read Method Common to the Embodiments

In each of the first to fourth embodiments each making use of the memory section MEM as described above and each of the sixth to eighth embodiments explained earlier, the following read method based on a global exposure operation can be well implemented.

FIGS. 36A to 36G are a plurality of model diagrams referred to in the following description of an electric-charge exhausting operation, a global exposure operation or an electric-charge accumulation operation, a read operation and an electric-charge transfer operation which are carried out by a unit pixel employing a memory section. The following description sequentially refers to FIGS. 36A to 36G. FIGS. 36A to 36G are a plurality of model diagrams each showing a well-type distribution of electric potentials generated by electrons serving as opto-electric charge. A variety of gates shown in the figure include the first transfer gate TRX of the first transfer gate transistor, the second transfer gate TRG of the second transfer gate transistor and the reset gate RST of the reset transistor 104. Each of these gates controls the electric-potential barrier of a transistor having the gate in order to put the transistor in a conductive or non-conductive state. That is to say, in the following description, a gate is said to be turned on or off in order to respectively lower or raise the electric-potential barrier of a transistor having the gate. With the electric-potential barrier lowered, the transistor having the gate is said to have been put in a conductive state and the gate is shown as a black painted rectangle in the figure. With the electric-potential barrier raised, on the other hand, the transistor having the gate is said to have been put in a non-conductive state and the gate is shown as a white painted rectangle.

FIG. 36A

First of all, all the gates TRX, TRG and RST are each turned on during the duration period of a pulse applied to each of the gates. In this state, opto-electric charge accumulated in the N-type embedded layer 114 of the opto-electric conversion section PD is exhausted simultaneously for all unit pixels in the electric-charge exhausting operation.

FIG. 36B

When the duration period of each of the pulses applied to the gates TRX, TRG and RST is ended, the global exposure operation also referred to as the simultaneous exposure operation is started to commence the operation to accumulate electric charge in the opto-electric conversion section PD for all unit pixels.

FIG. 36C

When the first gate TRX is turned on for all pixels at the same time, the exposure operation and the electric-charge accumulation operation are ended whereas an operation is carried out to transfer the electric charge from the opto-electric conversion section PD to the memory section MEM and held in the memory section MEM.

FIG. 36D

After the exposure operation has been ended, the vertical driving section sets the reset pulse RST in order to turn on the reset gate RST on a one-row-after-another basis. With the reset gate RST turned on, the floating diffusion capacitor FD is reset.

FIG. 36E

Then, the vertical driving section drives the gates of the select transistors 106 employed in the read section through the pixel driving line 16 or, strictly speaking, the SEL driving signal lines 16S oriented in the row direction sequentially on a one-row-after-another basis in order to read out a reset level sequentially on a one-row-after-another basis.

FIG. 36F

Subsequently, the second transfer gate TRG is turned on in order to transfer electric charge stored in the memory section MEM to the floating diffusion capacitor FD.

FIG. 36G

Later on, an operation to read out a signal level is carried out in the same way as the operation to read out the reset level as described above. Since reset noises included in the signal level match reset noises represented by the reset level, typically, a signal processing circuit provided at a later stage is capable of carrying out processing to eliminate noises including kTC noises.

By adopting a pixel structure including the memory section MEM in addition to the floating diffusion capacitor FD as described above, it is possible to carry out processing to eliminate noises including kTC noises. The memory section MEM is a memory for temporarily storing electric charge accumulated in the embedded-type opto-electric conversion section PD or, strictly speaking, the N-type embedded layer 114.

By applying the present invention, it is possible to effectively prevent noise components caused by, among others, smear noises other than kTC noises from being superposed on signal electric charge. The noise components caused by smear noises and the like are not superposed on the reset level. Thus, the signal processing circuit provided at a later stage is not capable of eliminating these noise components which cause the quality of the image to deteriorate. By applying the present invention, however, it is possible to generate a high-quality image with noises eliminated or sufficiently suppressed.

10: Modified System Configurations

In accordance with the embodiments described so far, in the configuration of the CMOS image sensor 10 shown in FIG. 10, the data storage section 19 is provided to carry out processing concurrently with the signal processing section 18 provided at a stage following the column processing section 13.

However, the system configuration is by no means limited to the configuration shown in FIG. 10.

Figure 37:
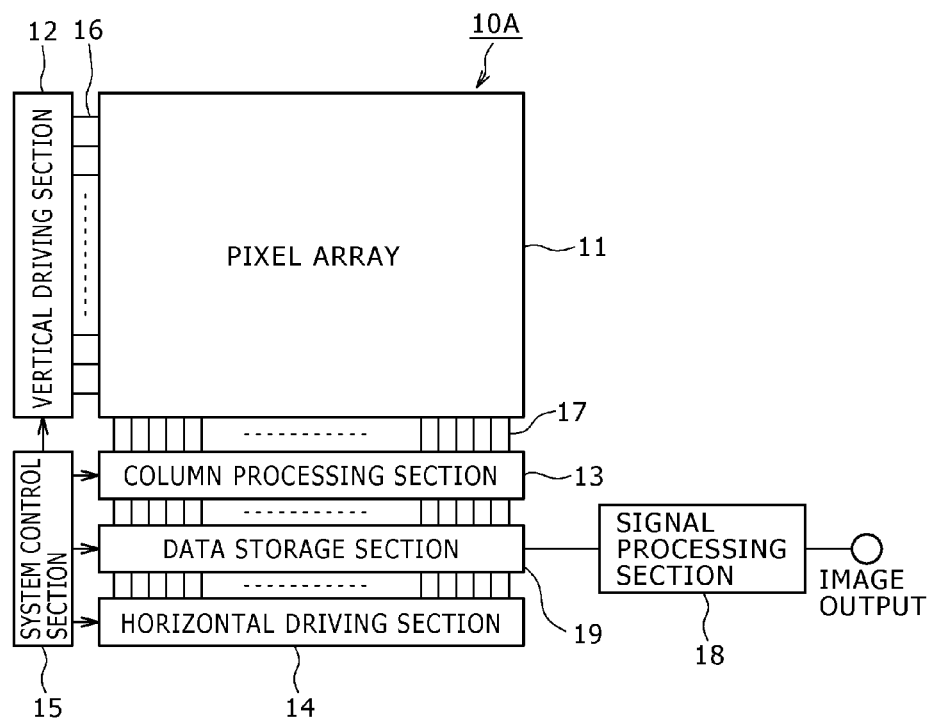
FIG. 37 is a block diagram showing a first typical modified system.

As shown in FIG. 37 for example, the data storage section 19 is provided to carry out processing concurrently with the column processing section 13.

In the system configuration, it is possible to adopt a processing method by which the horizontal driving section 14 simultaneously reads out electric charge accumulated in the opto-electric conversion section PD and electric charge stored in the memory section MEM at the same time in a horizontal scan operation and, then, the signal processing section 18 provided at a later stage carries out signal processing on them. In this case, as is obvious from FIG. 2, the electric charge stored in the memory section MEM is read out from the read section connected to the N-type area 103 which is the normal path. However, the electric charge accumulated in the opto-electric conversion section PD is read out at the same time directly from the memory section 107.

For the reason described above, it is necessary to provide a configuration in which the memory section 107 is connected to the read section as an impurity area having an equivalent capacitance and the same concentration profile as the N-type area 103. Such a configuration is referred to as a double-FD structure because the configuration has two FDs (floating diffusion) capacitors.

The double-FD structure including the second FD used as a replacement for the memory section MEM can be adopted in the embodiments described above except the fifth embodiment having a single-FD structure. Even if the double-FD structure is adopted, the present invention can be applied in the same way as the embodiments.

Figure 38:
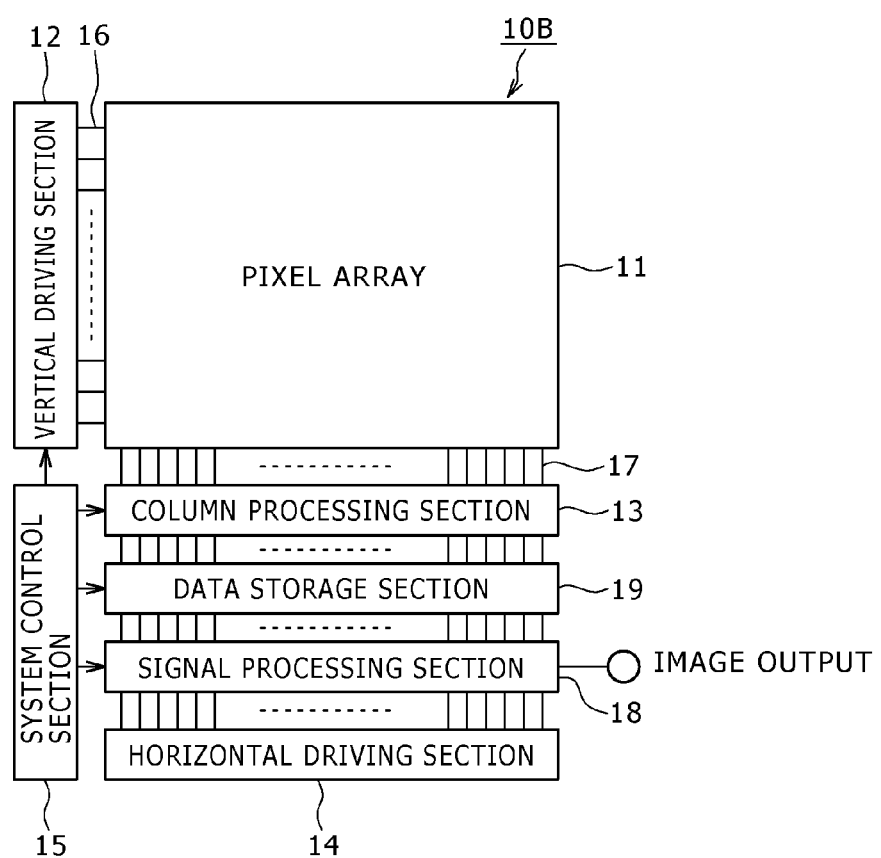
FIG. 38 is a block diagram showing a second typical modified system.

FIG. 38 is a block diagram showing a second typical modified system in which the column processing section 13 is provided with an AD (analog to digital) conversion function for carrying out AD conversion processing for every column of the pixel array 11 or for every plurality of columns in the pixel array 11. In addition, the signal processing section 18 and the data storage section 19 are provided to carry out processing concurrently with the column processing section 13.

In this configuration, after the signal processing section 18 has carried out noise elimination processing by adoption of an analog or digital technique, the signal processing section 18 and the data storage section 19 perform various kinds of processing for every column of the pixel array 11 or for every plurality of columns in the pixel array 11.

11: Other Modified Versions

The electric-charge holding section provided between the opto-electric conversion section and the floating diffusion capacitor FD playing a role as a section for converting electric charge into a voltage expressed in terms of variations in electric potential is by no means limited to the memory section MEM and the double-FD structure including the second FD used as a replacement for the memory section MEM. That is to say, the electric-charge holding section can be any area as far as the area can be used for temporarily accumulating electric charge.

The technical term 'at the same time for all unit pixels' used in the descriptions of the embodiments implies an entire pixel section for outputting a signal appearing as an image. The entire pixel section may not have to include dummy pixels and the like. In addition, in the pixel section for outputting a signal appearing as an image, only a pixel area determined in advance may be subjected to the simultaneous exposure operation. Nevertheless, the present invention can be applied to such a case.

Each of the embodiments described above is a typical implementation realizing a CMOS image sensor including a pixel array created as a matrix by 2-dimensionally laying out unit pixels each used for detecting signal charge, which has an amount determined by the quantity of visible light, as a physical quantity.

However, the scope of the present invention is by no means limited to the application of the present invention to the CMOS image sensor. That is to say, the present invention can also be applied to general solid-state image taking devices each adopting a column method making use of a column processing section provided for each pixel column of the pixel array.

In addition, the scope of the present invention is by no means limited to the application of the present invention to a solid-state image taking device for detecting a distribution of the quantity of incident visible light and taking an image representing the distribution. That is to say, the present invention can also be applied to a solid-state image taking device for detecting a distribution of another quantity such as the quantity of an incident infrared ray or an X ray or a distribution of the number of particles and taking an image representing the distribution. In a broader sense, the present invention can also be applied to general solid-state image taking devices each used for detecting a distribution of another physical quantity such as a pressure or a static capacitance and taking an image representing the distribution. Also referred to as physical-quantity distribution detection apparatus, the general solid-state image taking devices include a fingerprint detection sensor.

It is to be noted that the solid-state image taking device can be created as one chip or as a module created by integrating the image taking section and the signal processing section or the optical system in a package having an image taking function.

In addition, the memory section MEM can be created to have a HAD structure. It is to be noted that the HAD structure does not have to be a structure provided with a P-type substrate surface area in advance. That is to say, the HAD structure can be any structure as long as the structure induces an accumulation layer of minority carriers such as holes on the surface of the substrate during a period in which electric charge is transferred and held. For example, the HAD structure can be a structure inducing holes on the surface of the substrate due to an action of a film electrically charged to a negative electric potential.

In addition, the scope of the present invention is by no means limited to the application of the present invention to the solid-state image taking devices. That is to say, the present invention can also be applied to a general electronic apparatus employing a solid-state image taking device in the image taking section (that is, the opto-electric conversion section) of the apparatus. Typical examples of the electronic apparatus are an image taking apparatus, a terminal having the image taking function and a copy machine employing a solid-state image taking device in the image reading section thereof. Typical examples of the image taking apparatus are a digital still camera and a video camera whereas a typical example of the terminal is a hand-held phone. It is to be noted that the solid-state image taking device according to the present invention can be mounted on the electronic apparatus as a module cited before. That is to say, in the case of the image taking apparatus used as the electronic apparatus, the image taking apparatus serves as a camera module.

12: Typical Applications

Embodiments of Electronic Apparatus

Figure 39:
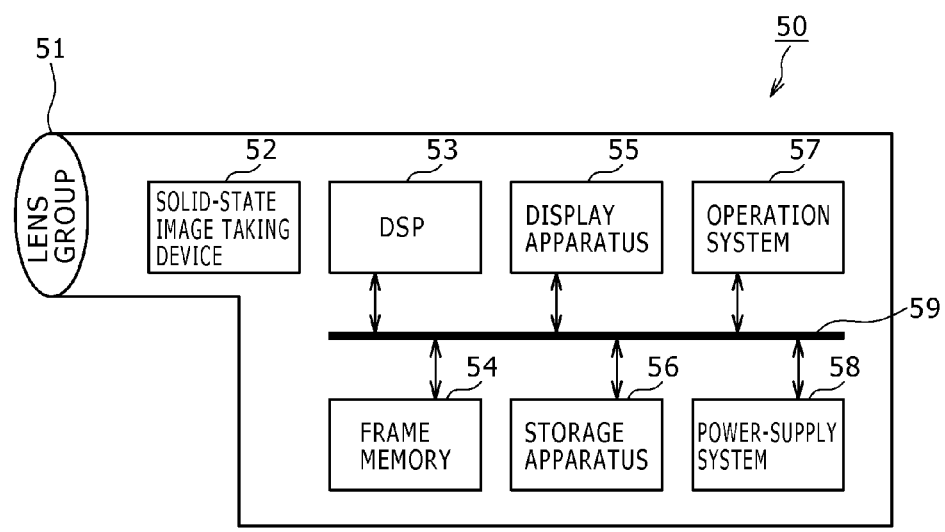
FIG. 39 is a block diagram showing a typical configuration of an electronic apparatus such as an image taking apparatus to which the embodiments of the present invention are applied.

FIG. 39 is a block diagram showing a typical configuration of an electronic apparatus such as an image taking apparatus 50 to which the present invention is applied.

As shown in FIG. 39, the image taking apparatus 50 according to the present invention employs an optical system, a solid-state image taking device 52, a DSP circuit 53, a frame memory 54, a display apparatus 55, a recording apparatus 56, an operation system 57 and a power-supply system 58. The optical system includes a lens group 51 whereas the DSP circuit 53 functions as a camera-signal processing section. In addition, the DSP circuit 53, the frame memory 54, the display apparatus 55, the recording apparatus 56, the operation system 57 and the power-supply system 58 are connected to each other by a bus line 59.

The lens group 51 receives incident light (also referred to as image light) from an image taking object and creates an image on the image taking surface of the solid-state image taking device 52 on the basis of the light. The solid-state image taking device 52 converts the quantity of the incident light serving as a basis for creating the image on the image taking surface of the solid-state image taking device 52 into an electrical signal for every unit pixel and outputs the electrical signal to the DSP circuit 53 as a pixel signal. The solid-state image taking device 52 is typically the CMOS image sensor 10 according to any of the embodiments described before. That is to say, the solid-state image taking device 52 is capable of carrying out an image taking operation including a global exposure operation for getting rid of distortions.

The display apparatus 55 is a panel-type display apparatus such as liquid-crystal display apparatus or an organic EL (Electro Luminescence) display apparatus. The display apparatus 55 displays a moving or standstill image created on the image taking surface of the solid-state image taking device 52. The recording apparatus 56 records the moving or standstill image created on the image taking surface of the solid-state image taking device 52 on a recording medium such as a video tape or a DVD (Digital Versatile Disk).

In accordance with an operation carried out by the user on the operation system 57, the operation system 57 issues an operation instruction to carry out one of a variety of functions provided for the image taking apparatus 50. The power-supply system 58 generates operation power at a variety of levels and supplies the power to the DSP circuit 53, the frame memory 54, the display apparatus 55, the recording apparatus 56 and the operation system 57 at the levels proper for these power recipients.

As described above, the image taking apparatus 50 employs the CMOS image sensor 10 according to any of the embodiments explained before as the solid-state image taking device 52. Since the CMOS image sensor 10 is capable of reducing noises caused by variations in transistor threshold voltage and, hence, assuring a high S/N ratio, the quality of the taken image can be improved. Thus, the image taking apparatus 50 is capable of serving as a digital still camera, a video camera or a camera module used in a mobile equipment such as a hand-held phone.

13: Effects of the Embodiments

In the case of the first embodiment, in a unit pixel, the opto-electric conversion section PD serving as an electric-charge conversion element and the electric-charge holding section are laid out in the scan direction. In addition, the distance between the electric-charge conversion element and an adjacent electric-charge holding section on the scan-direction downstream side of the electric-charge conversion element is made longer than the distance between the electric-charge conversion element and an adjacent electric-charge holding section on the scan-direction upstream side of the electric-charge conversion element. For example, the distance between the electric-charge conversion element and an adjacent electric-charge holding section on the downstream side in the scan direction is at least two times the distance between the electric-charge conversion element and an adjacent electric-charge holding section on the upstream side in the scan direction. Thus, the noise unevenness in the pixel array can be reduced to typically about 1/10. In particular, it is possible to suppress abrupt noise unevenness in the scan second half of the pixel array.

In the case of the second and third embodiments for example, in an incident-light limiting member provided for every unit pixel receiving incident light, a distance to a light shielding edge on the downstream side in the scan direction as seen from an electric-charge accumulation section is made longer than a distance to a light shielding edge on the upstream side in the scan direction as seen from the electric-charge accumulation section in order to give the same noise-unevenness reduction effect as the effect described above.

By adoption of a unit-pixel structure in which the electric-charge conversion element and the electric-charge holding section are laid out in the scan direction, it is possible to eliminate a light shielding film between electric-charge conversion elements adjacent to each other in the horizontal direction as is the case with typically the sixth embodiment. Thus, the sensitivity can be enhanced.

By adoption of a structure in which a light shielding film between electric-charge conversion elements adjacent to each other in the horizontal direction can be said to have been eliminated because the light shielding film is used as a replacement for a vertical signal line. Thus, due to the reduction of the number of vertical signal lines excluding the vertical signal line replaced by the light shielding film, it is possible to raise the degree of freedom to design the layout and, due to an increased wire opening size, it is possible to improve the sensitivity.

In addition, on a joint between at least two unit pixels adjacent to each other in the horizontal direction, one or more gate electrodes are created to serve as common electrodes to be shared by the unit pixels as is the case with typically the seventh embodiment. As a result, it is possible to raise the degree of freedom to design the layout and increase the sizes of areas to be occupied by the electric-charge conversion element and the electric-charge holding section.

The present application contains subject matter related to that disclosed in Japanese Priority Patent Application JP 2010-070252 filed in the Japan Patent Office on Mar. 25, 2010, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A solid-state image taking device comprising:
   a pixel section including a plurality of unit pixels laid out in a pixel matrix and to serve as unit pixels which have read sections and are each provided with a pixel opening prescribed by an optical-path limiting section provided on a semiconductor substrate, an opto-electric conversion section and an electric-charge holding section; and
   a scan driving section configured to control an operation to transfer electric charge from said opto-electric conversion sections to said electric-charge holding sections at the same time for said unit pixels in a predetermined pixel area in said pixel matrix and to scan and drive said read sections in one scan direction of a scan operation,
   wherein,
      on each pixel column including said unit pixels laid out in said scan direction, said opto-electric conversion section and said electric-charge holding section are laid out alternately and repeatedly,
      in each of said unit pixels on each of said pixel columns, said electric-charge holding section is placed on a start side of said scan operation whereas said opto-electric conversion section is placed on an end side of said scan operation,
      said scan driving section comprises a first scan driving circuit configured to scan and drive a plurality of first pixel rows included in said pixel matrix in a direction of said pixel column in a first scan driving operation and a second scan driving circuit configured to scan and drive a plurality of second pixel rows included in said pixel matrix in another direction of said pixel column in a second scan driving operation, said first pixel row and said second pixel row form a line-symmetrical pattern symmetrical with respect to an axis line passing through a middle point between said first pixel row and said second pixel row in the direction of said pixel row and, on every pixel column, said unit pixel on said first pixel row and said unit pixel on said second pixel row form a point-symmetrical pattern symmetrical with respect to a middle point between the center point of the contour encircling said unit pixel on said first pixel row and the center point of the contour encircling said unit pixel on said second pixel row, and the direction of said first scan driving operation carried out by said first scan driving circuit is opposite to the direction of said second scan driving operation carried out by said second scan driving circuit.

2. An electronic apparatus comprising an image processing section and an image input section including an optical system having a solid-state image taking device, the solid-state image taking device including:

a pixel section including a plurality of unit pixels laid out in a pixel matrix as unit pixels which have read sections and are each provided with a pixel opening prescribed by an optical-path limiting section created on a semiconductor substrate, an opto-electric conversion section and an electric-charge holding section; and a scan driving section configured to control an operation to transfer electric charge from said opto-electric conversion sections to said electric-charge holding sections at the same time for all said unit pixels in said pixel matrix and to scan and drive said read sections in one scan direction, wherein, on each pixel column including said unit pixels laid out in said scan direction, said opto-electric conversion section and said electric-charge holding section are laid out alternately and repeatedly, on each of said pixel columns, two said electric-charge holding sections of two adjacent ones of said unit pixels are laid out disproportionately toward one side of said scan direction with respect to said optical-path limiting section or said opto-electric conversion section said scan driving section comprises a first scan driving circuit configured to scan and drive a plurality of first pixel rows included in said pixel matrix in a direction of said pixel column in a first scan driving operation and a second scan driving circuit configured to scan and drive a plurality of second pixel rows included in said pixel matrix in another direction of said pixel column in a second scan driving operation, said first pixel row and said second pixel row form a line-symmetrical pattern symmetrical with respect to an axis line passing through a middle point between said first pixel row and said second pixel row in the direction of said pixel row and, on every pixel column, said unit pixel on said first pixel row and said unit pixel on said second pixel row form a point-symmetrical pattern symmetrical with respect to a middle point between the center point of the contour encircling said unit pixel on said first pixel row and the center point of the contour encircling said unit pixel on said second pixel row, and the direction of said first scan driving operation carried out by said first scan driving circuit is opposite to the direction of said second scan driving operation carried out by said second scan driving circuit.

3. A solid-state image taking device comprising:

pixel means including a plurality of unit pixels laid out in a pixel matrix and to serve as unit pixels which have read sections and are each provided with a pixel opening prescribed by an optical-path limiting section created on a semiconductor substrate, an opto-electric conversion section as well as an electric-charge holding section; and scan driving means for controlling an operation to transfer electric charge from said opto-electric conversion sections to said electric-charge holding sections at the same time for said unit pixels in a predetermined pixel area in said pixel matrix and for scanning and driving said read sections in one scan direction, wherein, on each pixel column included in said predetermined pixel area determined to serve as a pixel column having said unit pixels laid out in said scan direction, said opto-electric conversion section and said electric-charge holding section are laid out alternately and repeatedly, on each of said pixel columns in said predetermined pixel area, two said electric-charge holding sections of two adjacent ones of said unit pixels are laid out disproportionately toward one side of said scan direction with respect to said optical-path limiting section or said opto-electric conversion section, said scan driving means comprises a first scan driving circuit configured to scan and drive a plurality of first pixel rows included in said pixel matrix in a direction of said pixel column in a first scan driving operation and a second scan driving circuit configured to scan and drive a plurality of second pixel rows included in said pixel matrix in another direction of said pixel column in a second scan driving operation, said first pixel row and said second pixel row form a line-symmetrical pattern symmetrical with respect to an axis line passing through a middle point between said first pixel row and said second pixel row in the direction of said pixel row and, on every pixel column, said unit pixel on said first pixel row and said unit pixel on said second pixel row form a point-symmetrical pattern symmetrical with respect to a middle point between the center point of the contour encircling said unit pixel on said first pixel row and the center point of the contour encircling said unit pixel on said second pixel row, and the direction of said first scan driving operation carried out by said first scan driving circuit is opposite to the direction of said second scan driving operation carried out by said second scan driving circuit.

4. A solid-state image taking device comprising:

pixel means including a plurality of unit pixels laid out in a pixel matrix and to serve as unit pixels which have read sections and are each provided with a pixel opening prescribed by an optical-path limiting section provided on a semiconductor substrate, an opto-electric conversion section and an electric-charge holding section; and scan driving means for controlling an operation to transfer electric charge from said opto-electric conversion sections to said electric-charge holding sections at the same time for said unit pixels in a predetermined pixel area in said pixel matrix and for scanning and driving said read sections in one scan direction of a scan operation, wherein,
- (a) on each pixel column including said unit pixels laid out in said scan direction, said opto-electric conversion sections and said electric-charge holding sections are laid out alternately and repeatedly,
- (b) in each of said unit pixels on each of said pixel columns, said electric-charge holding section is placed on a start side of said scan operation whereas said opto-electric conversion section is placed on an end side of said scan operation,
- (c) each said read section comprises: (i) a reset transistor configured to reset electric charge held in said electric-charge holding section or a floating diffusion capacitive section provided separately from said electric-charge holding section in accordance with control carried out by said scan driving section; (ii) an amplification transistor configured to amplify electric charge held in said electric-charge holding section or said floating diffusion capacitive section in order to generate an amplified signal and output said amplified signal; and (iii) a select transistor configured to control an operation to assert said amplified signal output by said amplification transistor on an output line in accordance with control carried out by said scan driving section, and
- (d) said reset transistor, said select transistor or both said reset transistor and said select transistor of each unit pixel are used as transistors having gate electrodes common to at least two unit pixels adjacent to each other on a pixel row in said pixel section in the direction of said pixel row and are shared by said adjacent unit pixels.

5. A solid-state image taking device comprising:

a pixel section including a plurality of unit pixels laid out in a pixel matrix and to serve as unit pixels which have read sections and are each provided with a pixel opening prescribed by an optical-path limiting section provided on a semiconductor substrate, an opto-electric conversion section and an electric-charge holding section; and a scan driving section configured to control an operation to transfer electric charge from said opto-electric conversion sections to said electric-charge holding sections at the same time for said unit pixels in a predetermined pixel area in said pixel matrix and to scan and drive said read sections in one scan direction of a scan operation, wherein,
- (a) on each pixel column including said unit pixels laid out in said scan direction, said opto-electric conversion section and said electric-charge holding section are laid out alternately and repeatedly,
- (b) in each of said unit pixels on each of said pixel columns, said electric-charge holding section is placed on a start side of said scan operation whereas said opto-electric conversion section is placed on an end side of said scan operation, (c) each said read section comprises: (i) a reset transistor configured to reset electric charge held in said electric-charge holding section or a floating diffusion capacitive section provided separately from said electric-charge holding section in accordance with control carried out by said scan driving section; (ii) an amplification transistor configured to amplify electric charge held in said electric-charge holding section or said floating diffusion capacitive section in order to generate an amplified signal and output said amplified signal; and (iii) a select transistor configured to control an operation to assert said amplified signal output by said amplification transistor on an output line in accordance with control carried out by said scan driving section, and
- (d) said reset transistor, said select transistor or both said reset transistor and said select transistor of each unit pixel are used as transistors having gate electrodes common to at least two unit pixels adjacent to each other on a pixel row in said pixel section in the direction of said pixel row and are shared by said adjacent unit pixels.

* * * * *